US011195860B2

(12) United States Patent
Kasahara et al.

(10) Patent No.: US 11,195,860 B2
(45) Date of Patent: Dec. 7, 2021

(54) DISPLAY UNIT AND ELECTRONIC APPARATUS

(71) Applicant: Sony Group Corporation, Tokyo (JP)

(72) Inventors: Naoya Kasahara, Kanagawa (JP); Michihiro Kanno, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/797,406

(22) Filed: Feb. 21, 2020

(65) Prior Publication Data
US 2020/0357827 A1 Nov. 12, 2020

Related U.S. Application Data

(63) Continuation of application No. 16/032,457, filed on Jul. 11, 2018, now Pat. No. 10,593,704, which is a (Continued)

(30) Foreign Application Priority Data

May 7, 2014 (JP) .................................. 2014-096177

(51) Int. Cl.
*H01L 29/12* (2006.01)
*H01L 27/12* (2006.01)
(Continued)

(52) U.S. Cl.
CPC ........... *H01L 27/1222* (2013.01); *G09G 3/20* (2013.01); *G09G 3/30* (2013.01); *G09G 3/3225* (2013.01); *G09G 3/3233* (2013.01); *H01L 27/124* (2013.01); *H01L 27/1255* (2013.01); *H01L 27/3262* (2013.01); *H01L 27/3276* (2013.01);
(Continued)

(58) Field of Classification Search
CPC ... H01L 27/12; H01L 27/1222; H01L 27/124; H01L 27/1255; H01L 27/3262; H01L 27/3276; G03G 3/20; G03G 3/30; G03G 3/3225; G03G 3/3233
See application file for complete search history.

(56) References Cited

U.S. PATENT DOCUMENTS 7,928,932 B2    4/2011 Yamaguchi
2004/0017162 A1 1/2004 Sato et al.
(Continued)

FOREIGN PATENT DOCUMENTS

JP    2007-079610 A    3/2007
JP    2008-039876 A    2/2008
(Continued)

OTHER PUBLICATIONS

US ExParte Quayle issued May 3, 2019 for corresponding U.S. Appl. No. 16/032,474.

*Primary Examiner* — Phuc T Dang
(74) *Attorney, Agent, or Firm* — Michael Best & Friedrich LLP

(57) ABSTRACT

A display unit of the present disclosure includes a plurality of pixel circuits each including a light-emitting element, a drive transistor that has a drain and a source and supplies a current to the light-emitting element, and a control transistor connected to the drain or the source of the drive transistor. One channel portion is formed for two control transistors in respective adjacent two of the pixel circuits.

9 Claims, 21 Drawing Sheets

Related U.S. Application Data continuation of application No. 15/127,745, filed as application No. PCT/JP2015/062521 on Apr. 24, 2015, now Pat. No. 10,115,739.

(51) Int. Cl.
    *G09G 3/3225*      (2016.01)
    *G09G 3/3233*      (2016.01)
    *G09G 3/20*      (2006.01)
    *G09G 3/30*      (2006.01)
    *H01L 27/32*      (2006.01)

(52) U.S. Cl.
    CPC .............. *G09G 2300/0426* (2013.01); *G09G 2300/0452* (2013.01); *G09G 2300/0814* (2013.01); *G09G 2300/0819* (2013.01); *G09G 2300/0852* (2013.01); *G09G 2310/0262* (2013.01)

(56) References Cited

U.S. PATENT DOCUMENTS

| | | | |
|---|---|---|---|
| 2005/0212787 A1* | 9/2005 | Noguchi | G09G 3/3233 345/204 |
| 2006/0022305 A1* | 2/2006 | Yamashita | G09G 3/2014 257/565 |
| 2007/0085782 A1 | 4/2007 | Matsumoto et al. | |
| 2009/0046041 A1* | 2/2009 | Tanikame | G09G 3/3233 345/76 |
| 2012/0056531 A1* | 3/2012 | Park | G09G 3/3233 313/506 |
| 2013/0002125 A1 | 1/2013 | Kimura et al. | |
| 2013/0140538 A1 | 6/2013 | Fujita | |
| 2013/0307006 A1 | 11/2013 | Koshihara | |
| 2014/0054562 A1 | 2/2014 | Lee | |
| 2014/0167049 A1* | 6/2014 | Oda | H01L 21/02691 257/57 |
| 2014/0307012 A1* | 10/2014 | Kishi | G09G 3/3233 345/691 |
| 2014/0353629 A1 | 12/2014 | Jin | |
| 2015/0161943 A1 | 6/2015 | Shim et al. | |
| 2015/0187818 A1 | 7/2015 | Miyaka et al. | |
| 2016/0012775 A1 | 1/2016 | Jeong et al. | |

FOREIGN PATENT DOCUMENTS

| | | |
|---|---|---|
| JP | 2010-145579 A | 7/2010 |
| JP | 2010-210905 A | 9/2010 |
| WO | WO-2013/069559 A1 | 5/2013 |

* cited by examiner

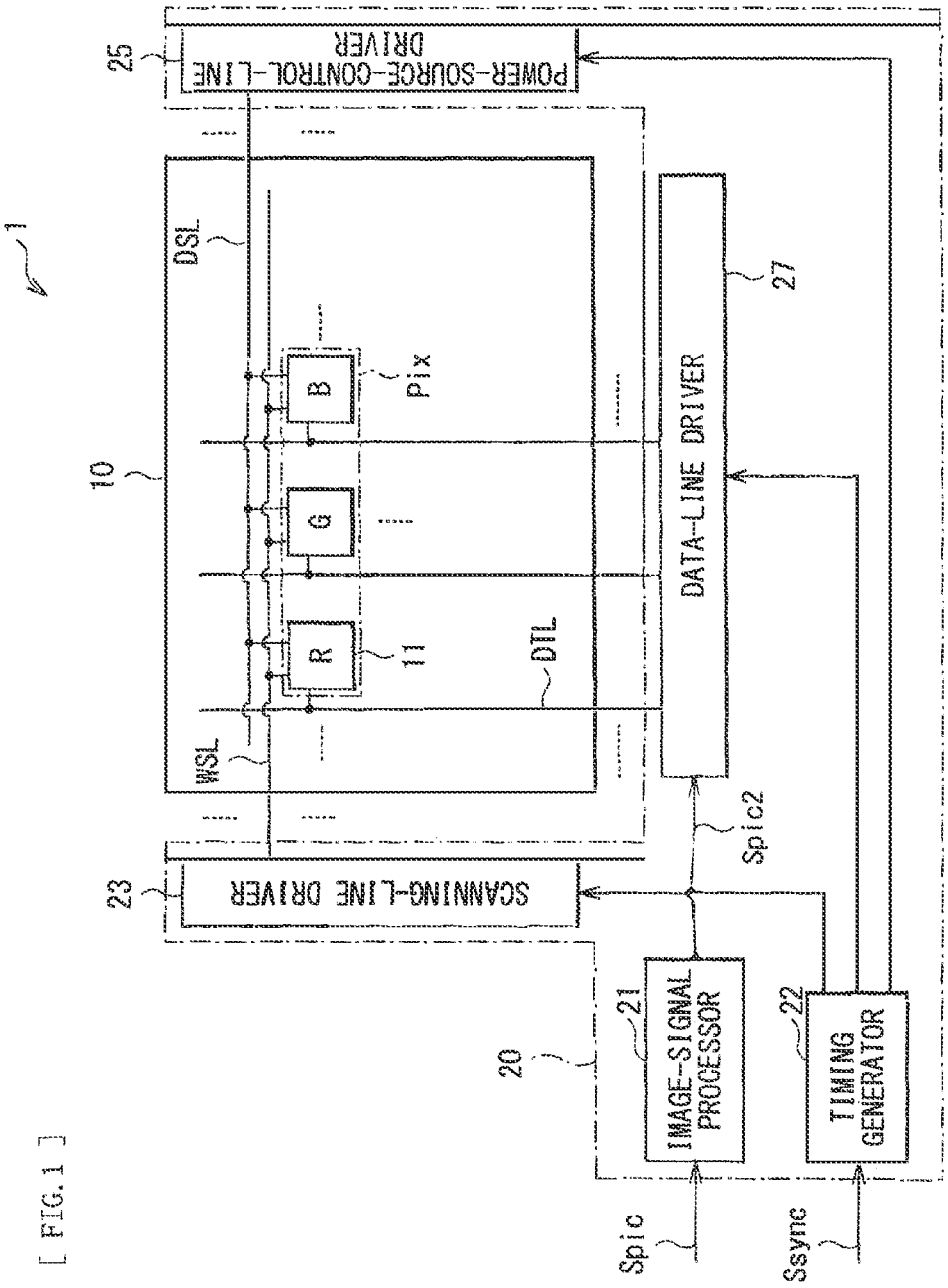
[FIG. 1]

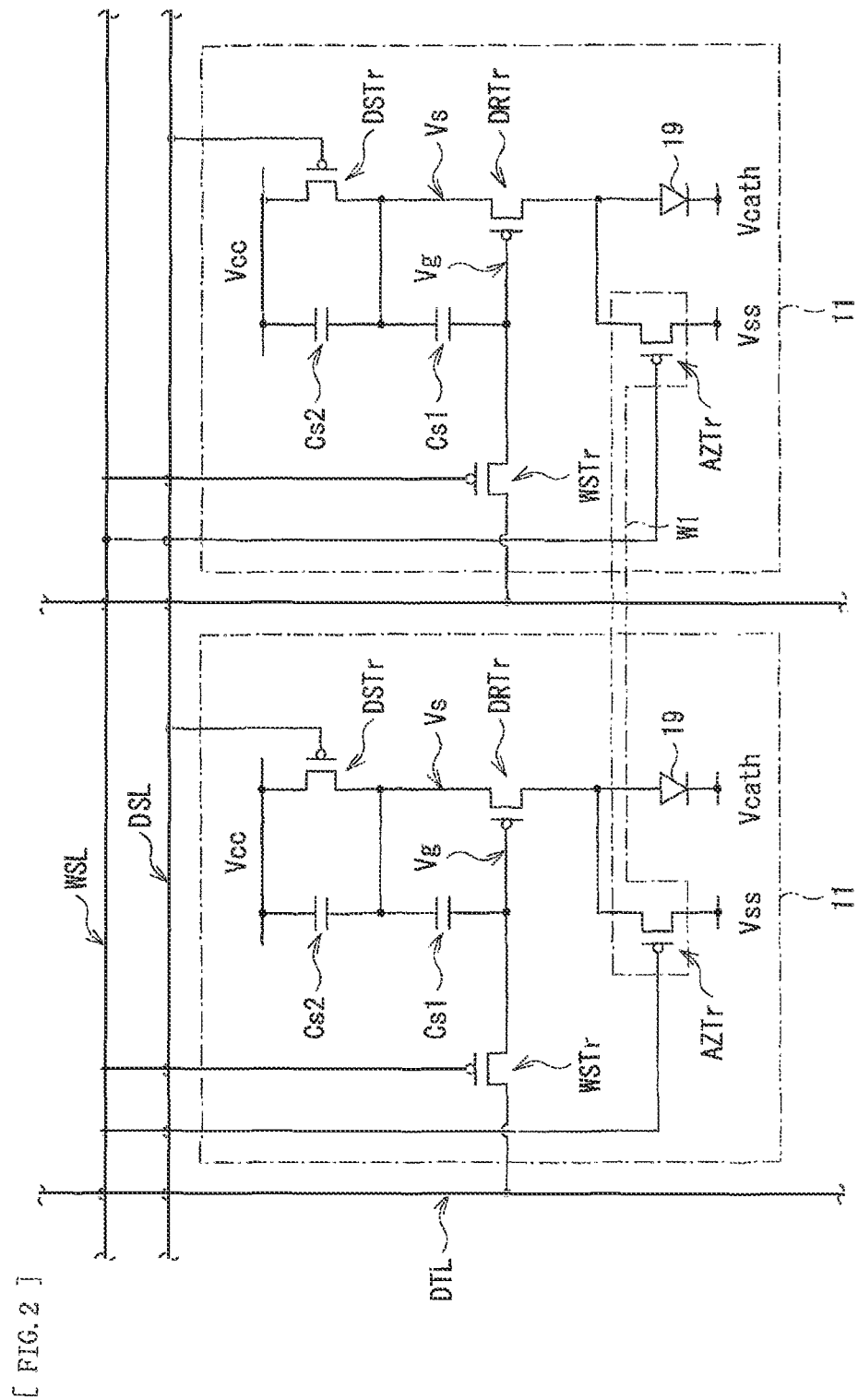
[ FIG. 2 ]

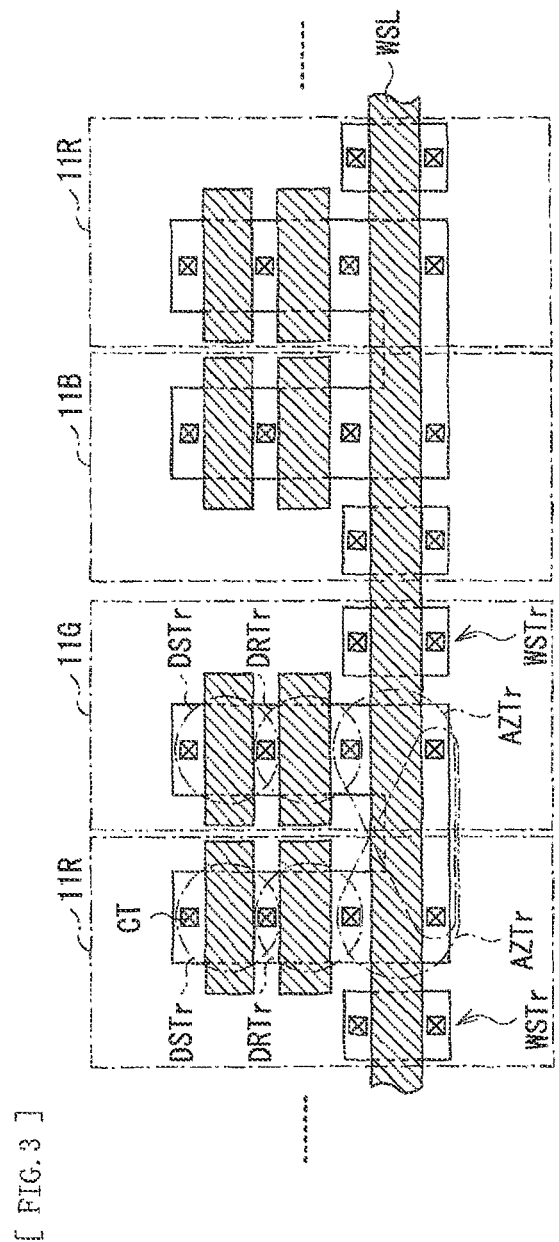

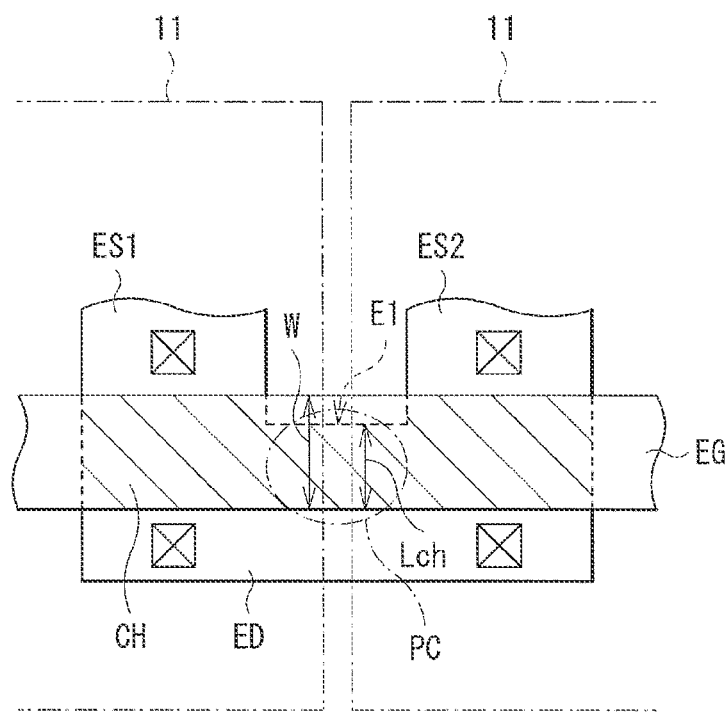
[FIG. 4]

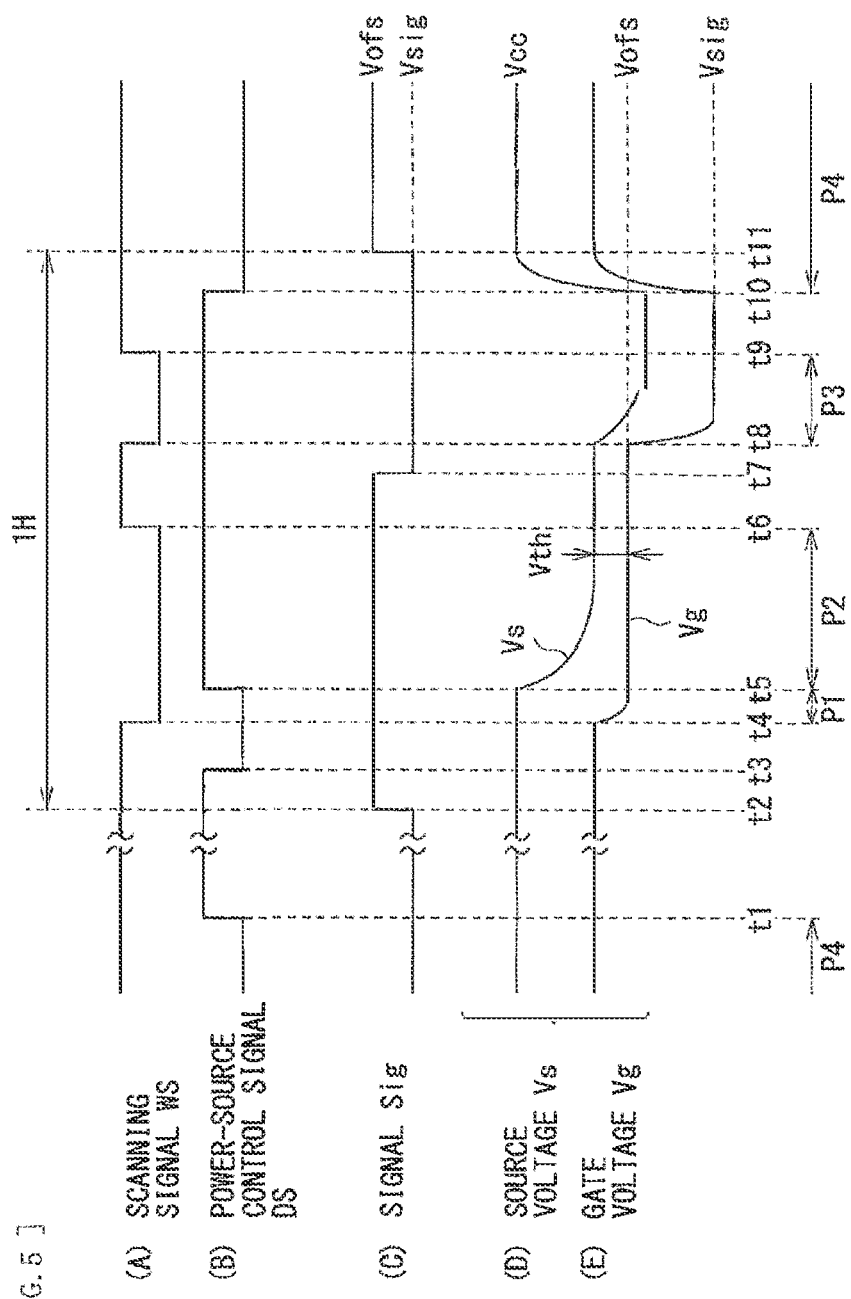
[FIG. 5]

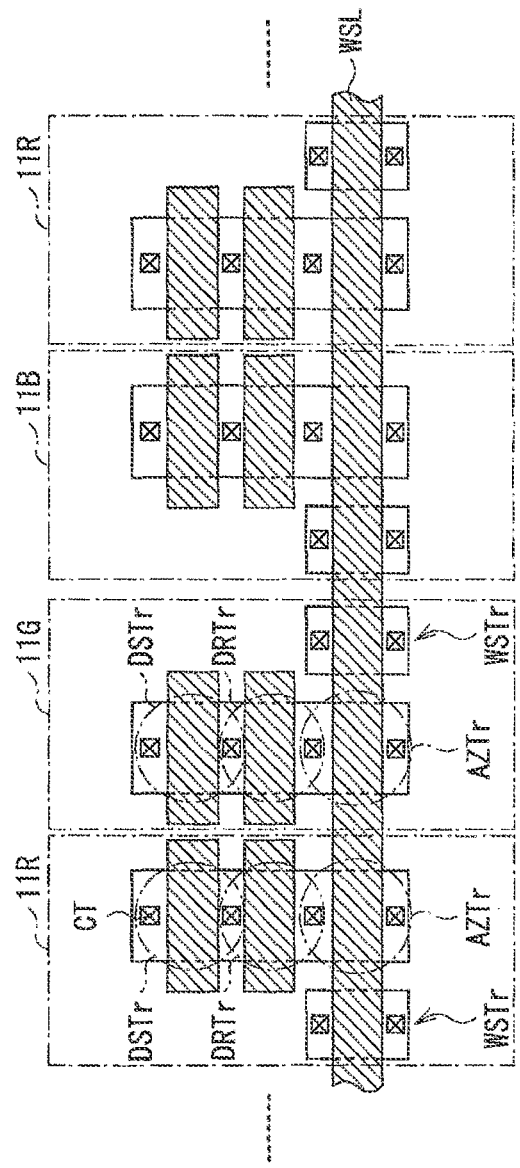
[FIG. 6]

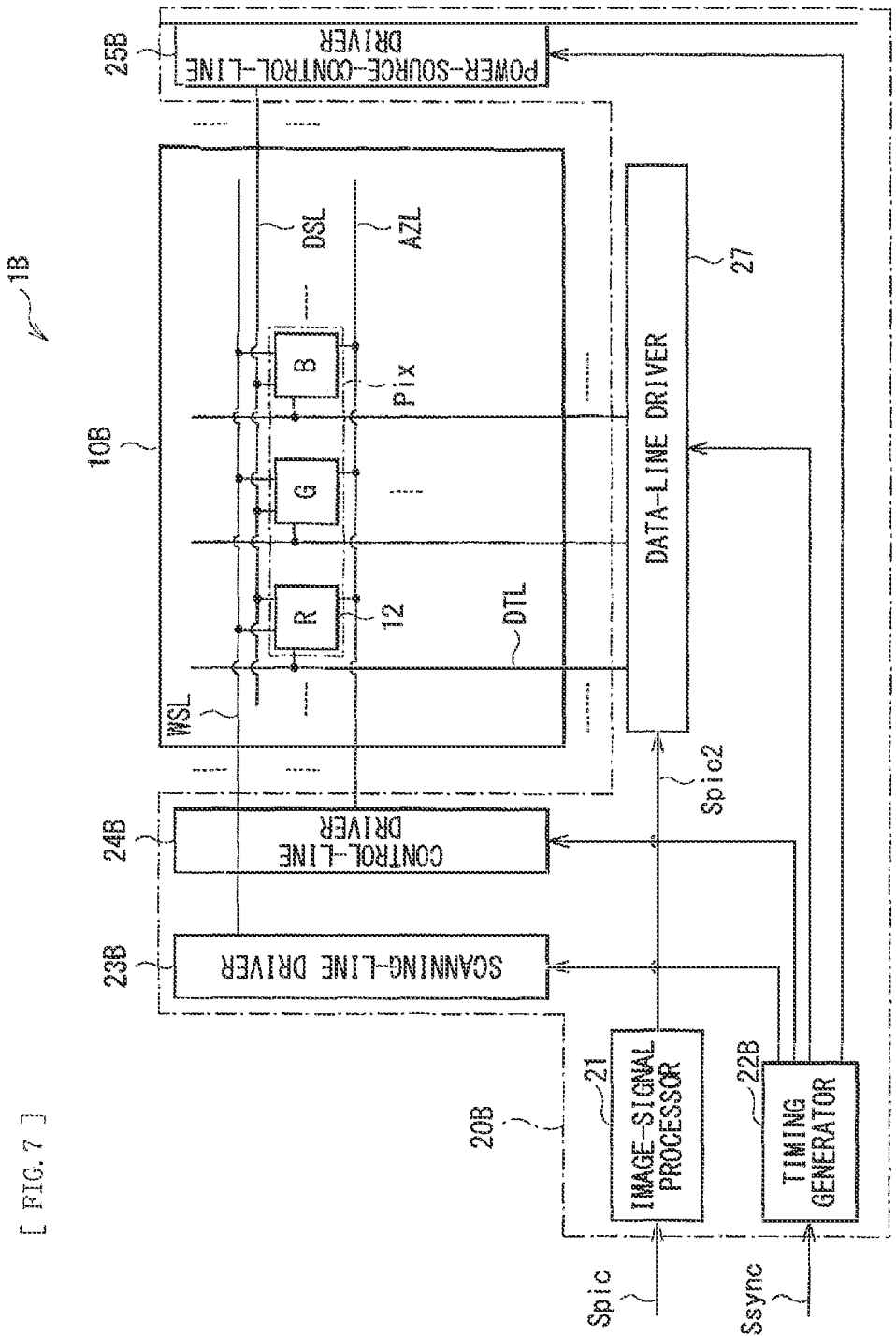
[FIG. 7]

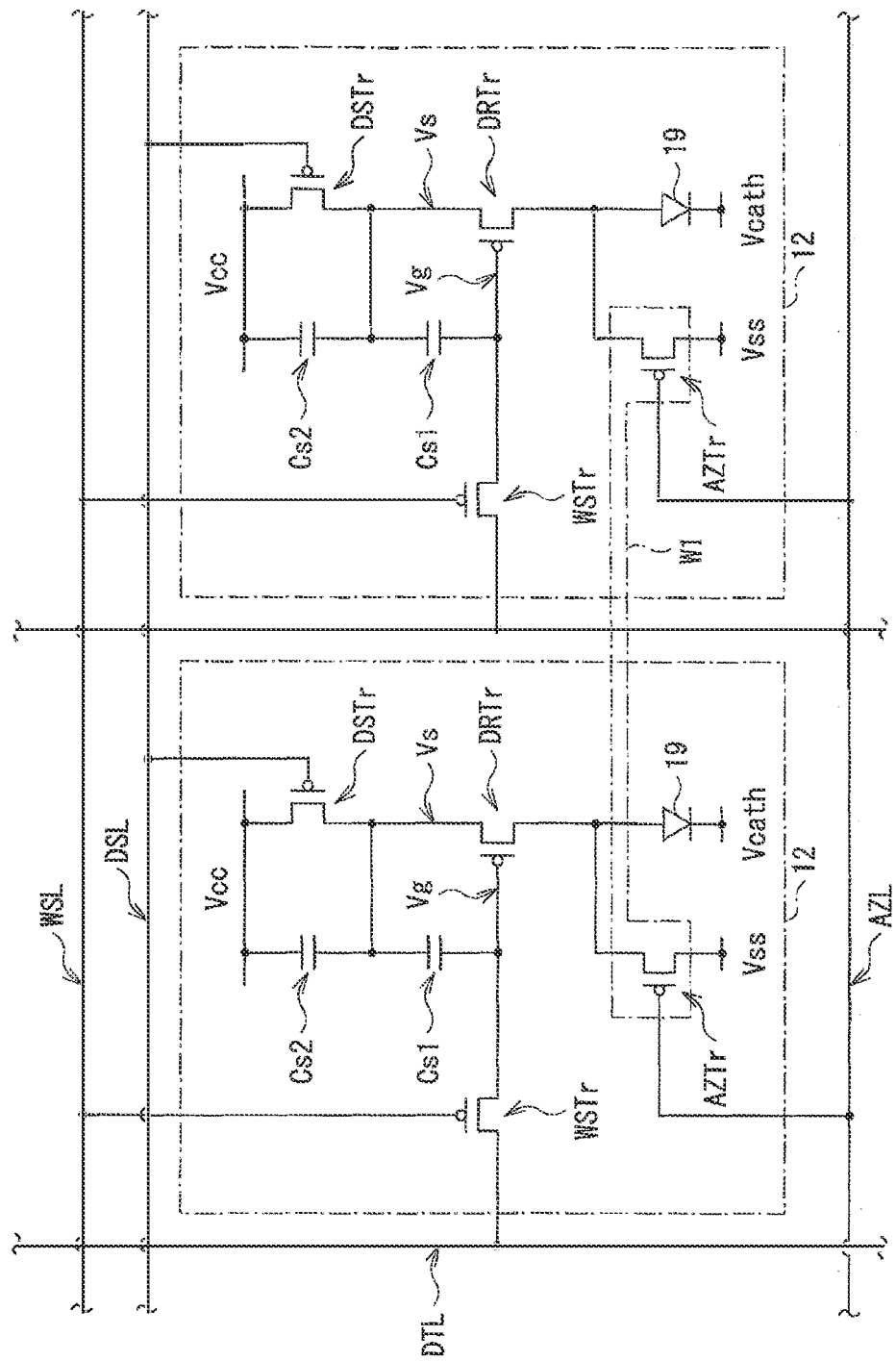
[FIG. 8]

[ FIG. 9 ]
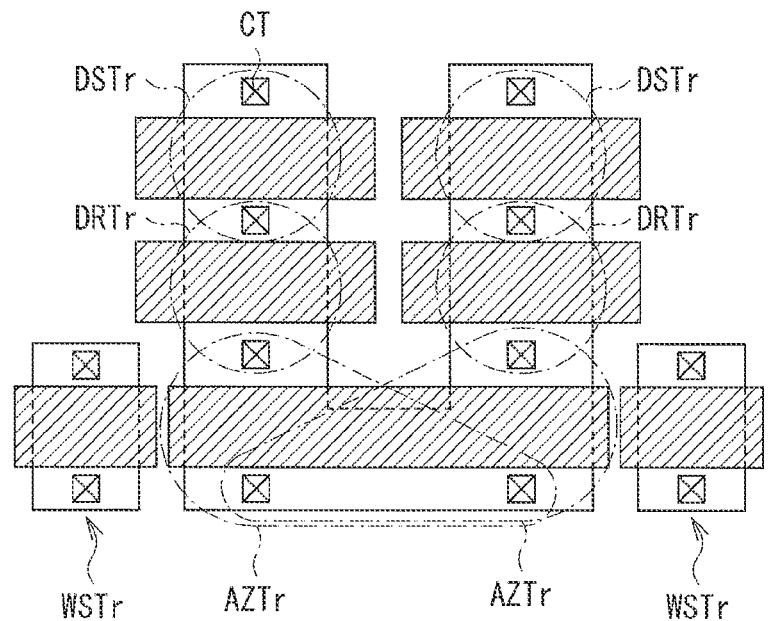
[ FIG. 10 ]
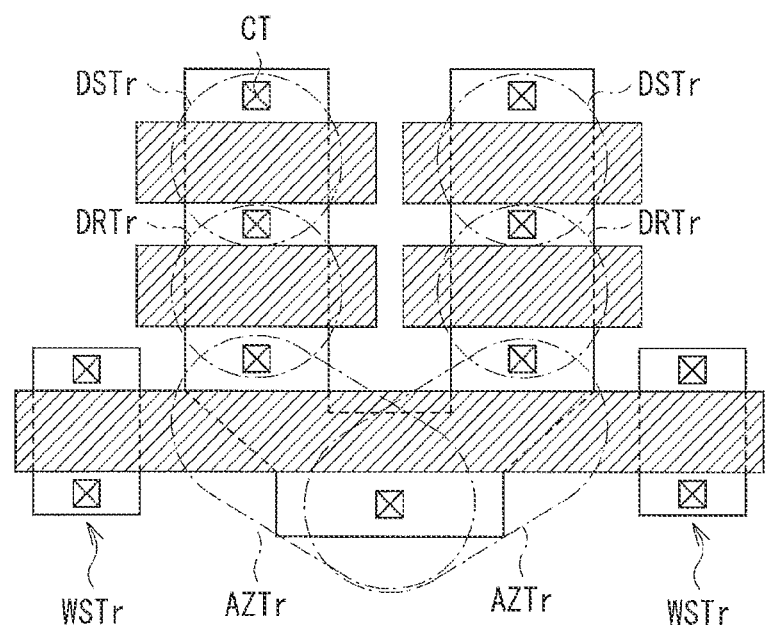

[ FIG. 11 ]
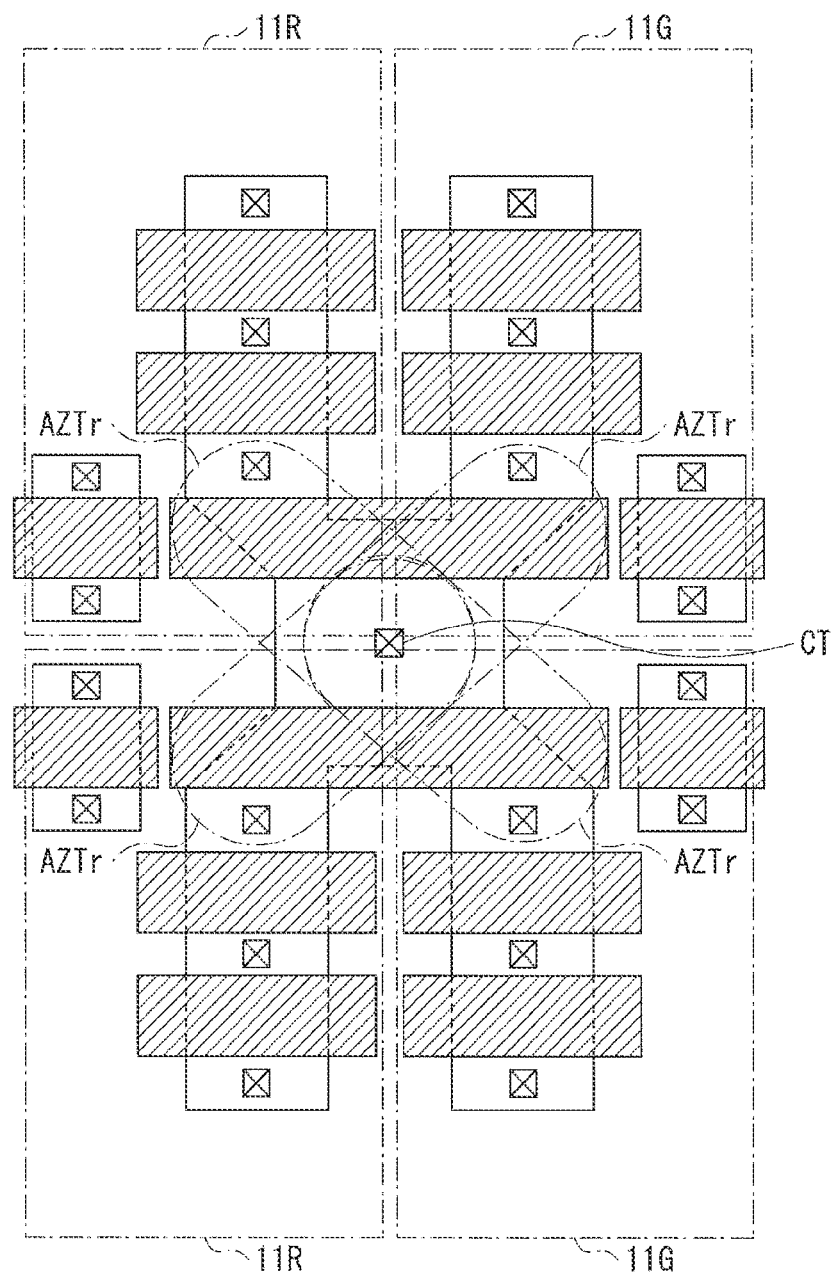

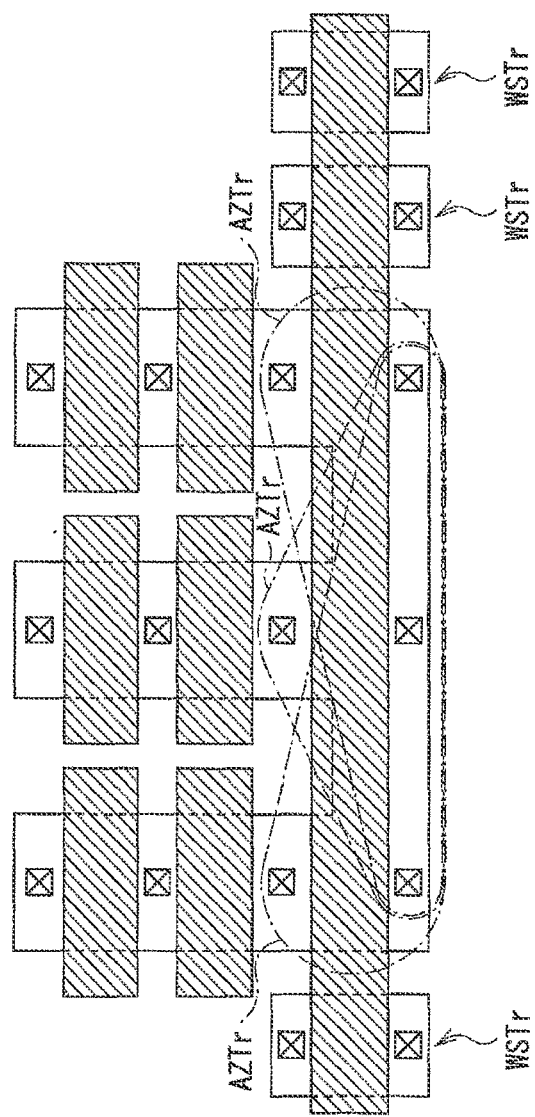

[ FIG. 13 ]
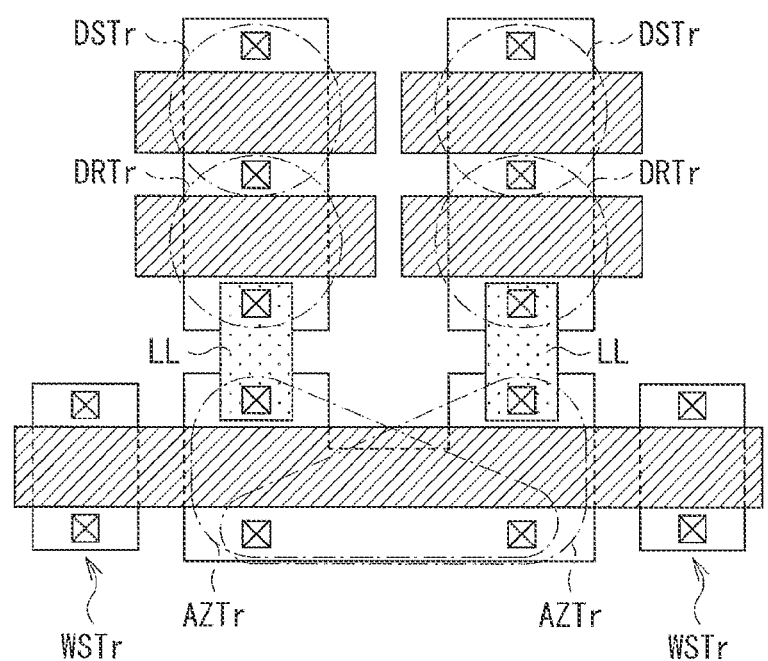

[ FIG. 14 ]
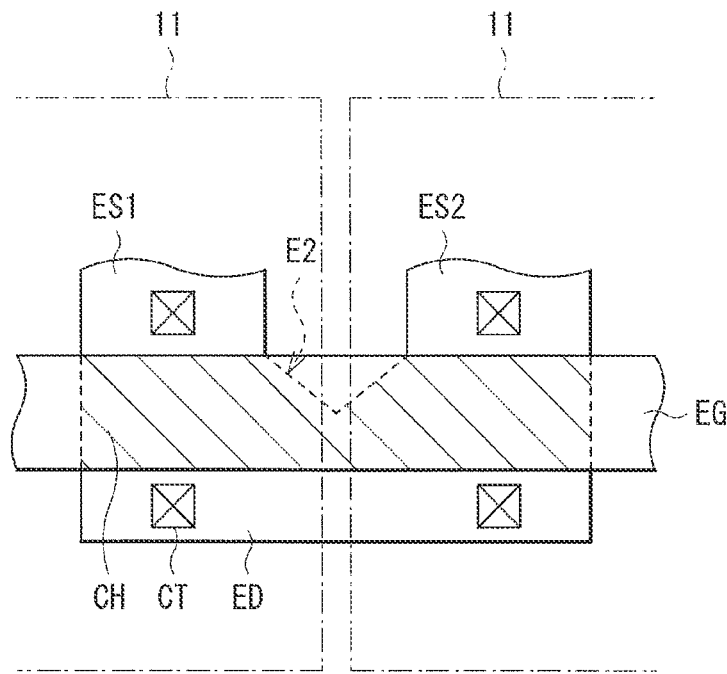
[ FIG. 15 ]
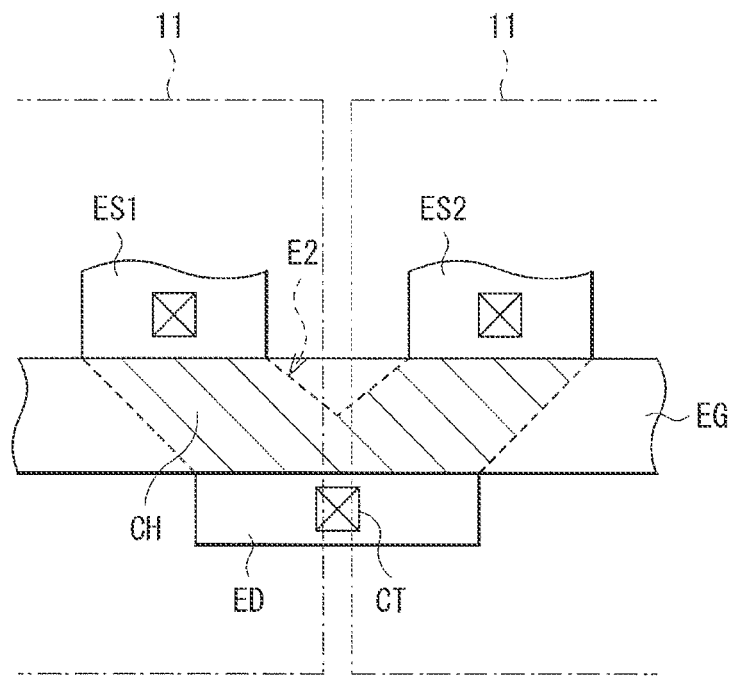

[ FIG. 16 ]
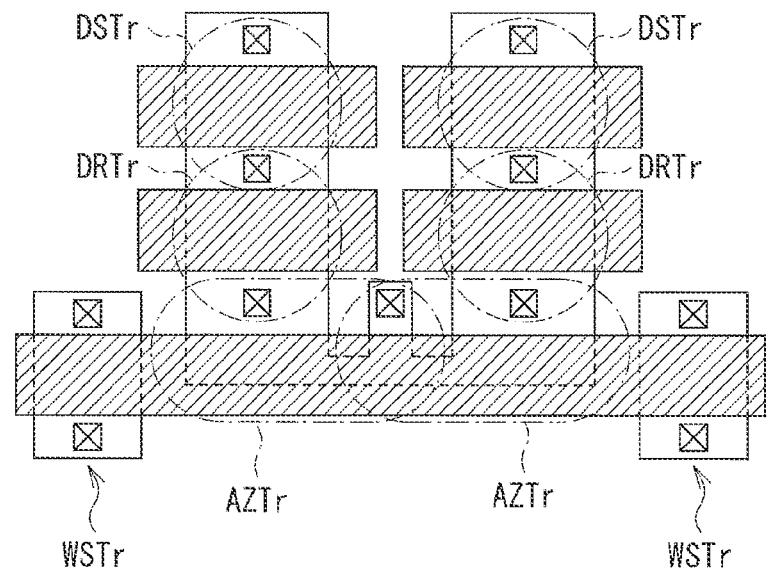
[ FIG. 17 ]
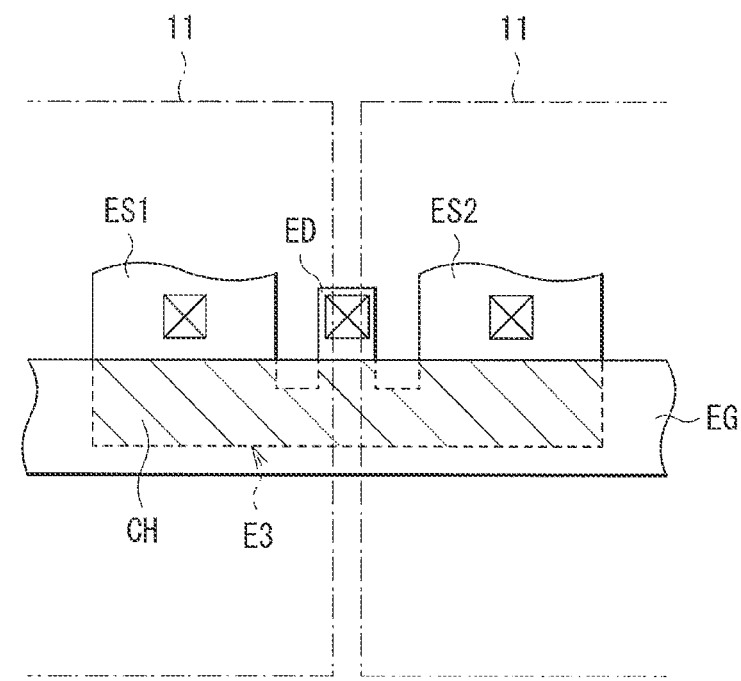

[ FIG. 18 ]
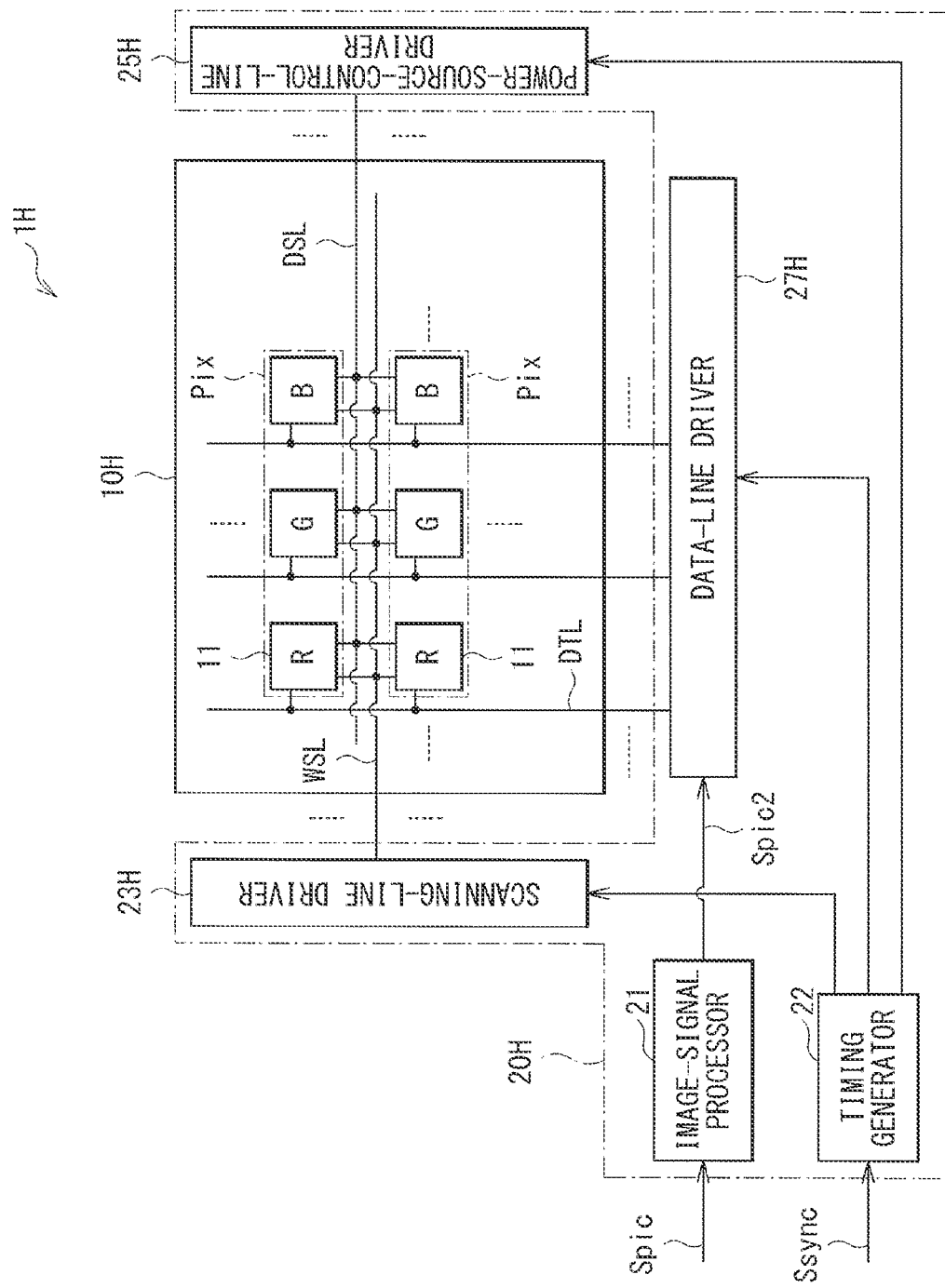

[ FIG. 19 ]
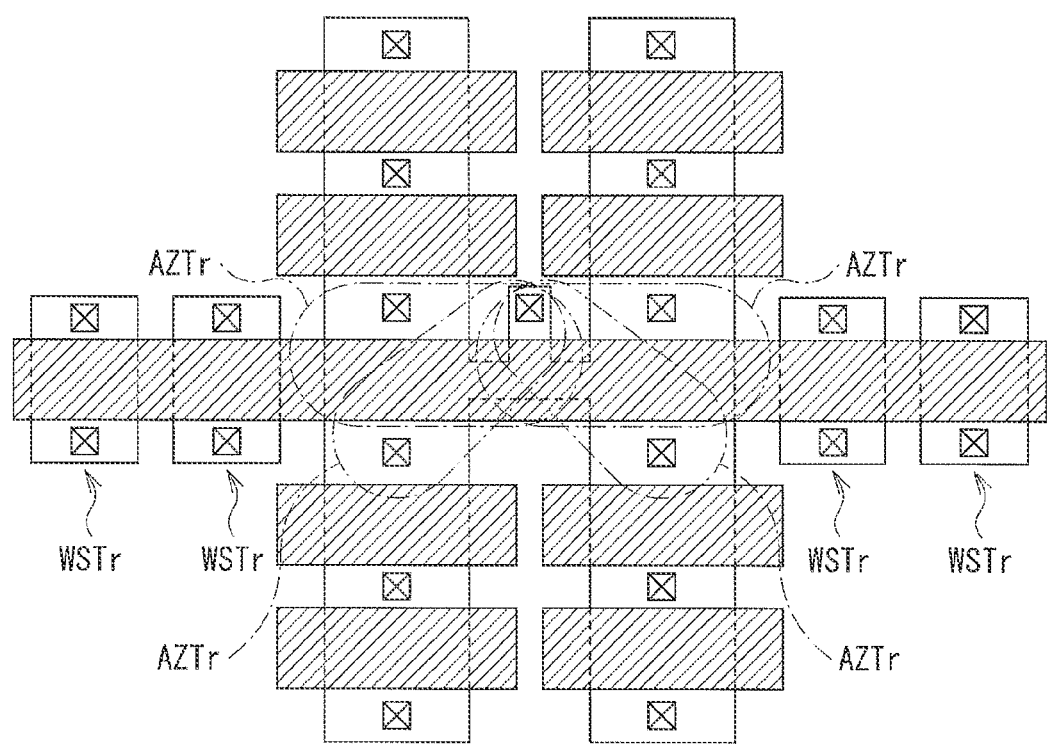

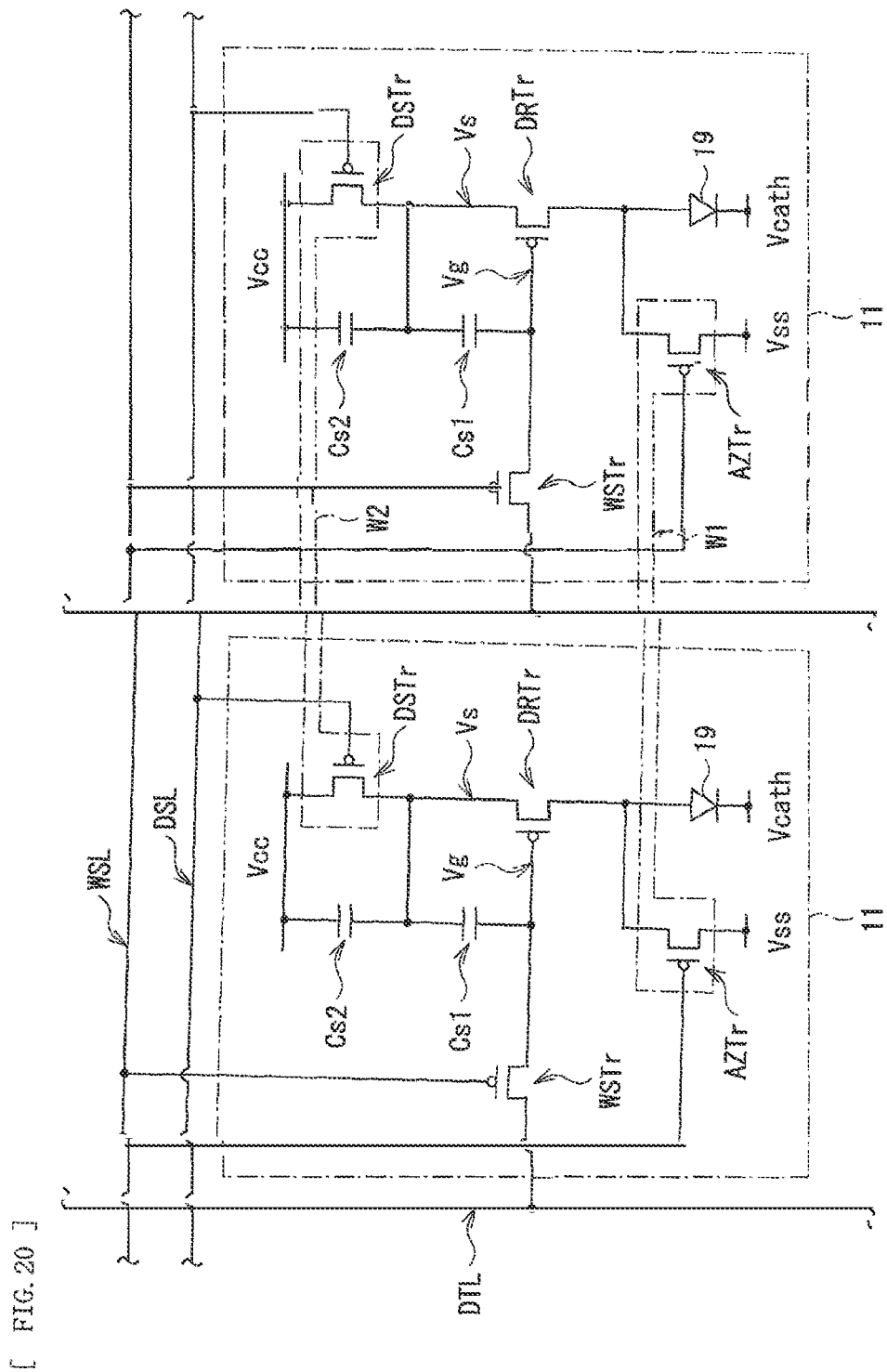
[ FIG. 20 ]

[ FIG. 21 ]
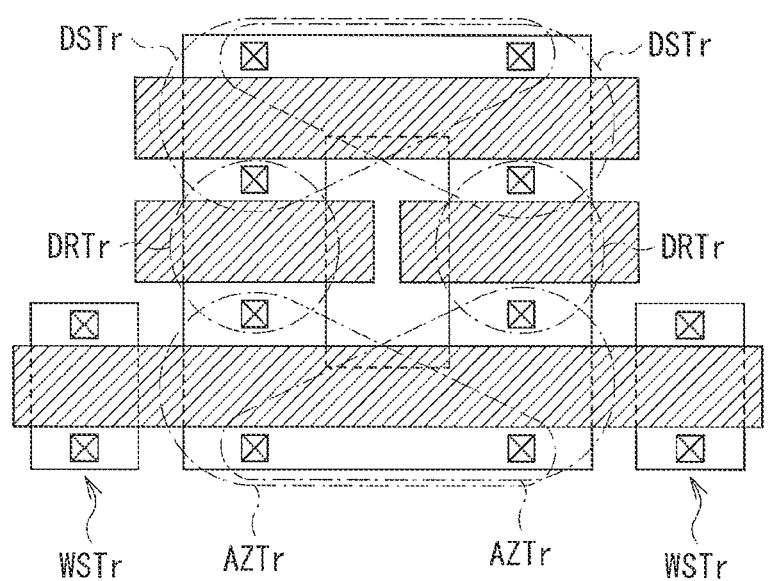

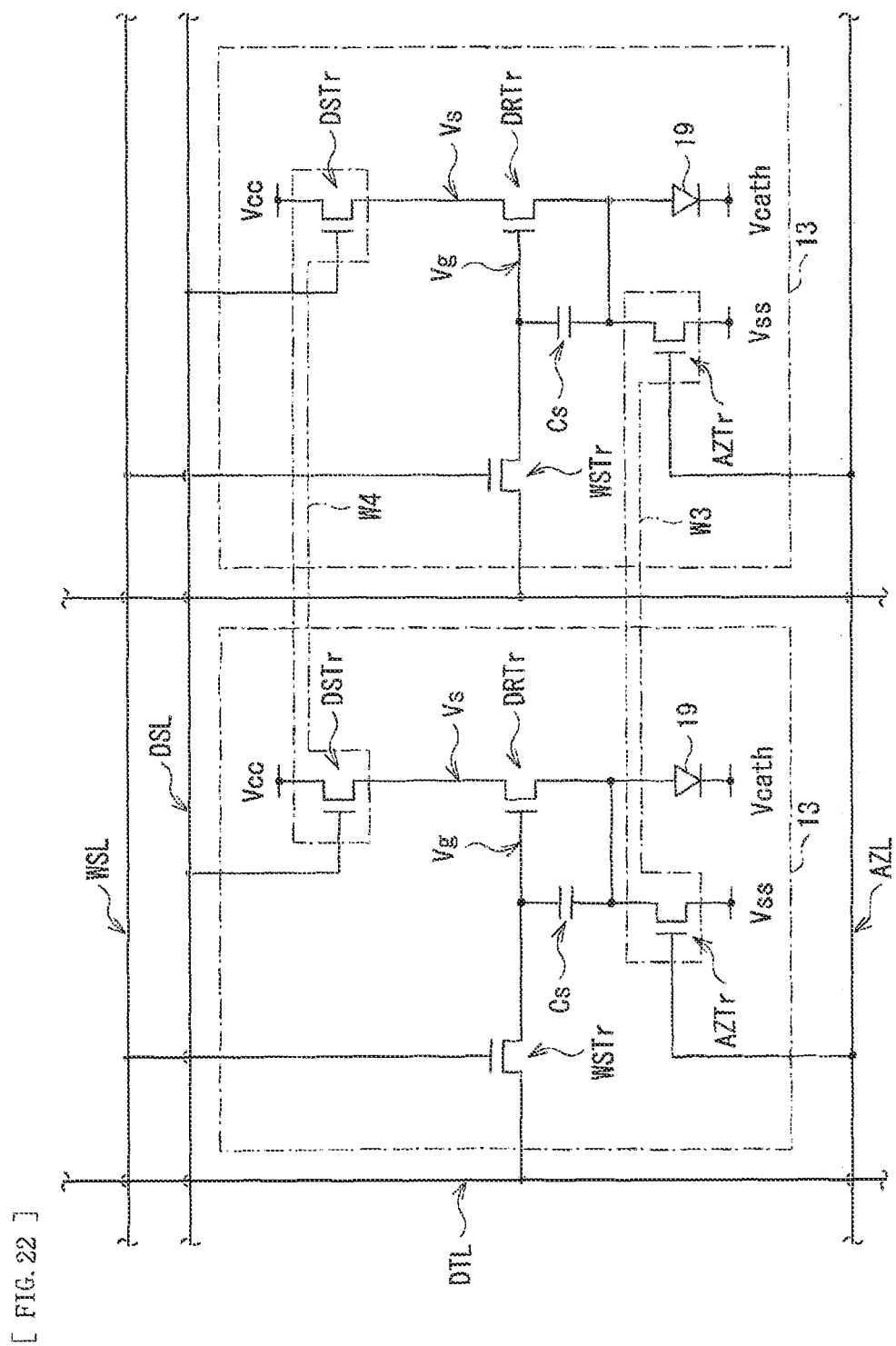
[ FIG. 22 ]

[ FIG. 23 ]
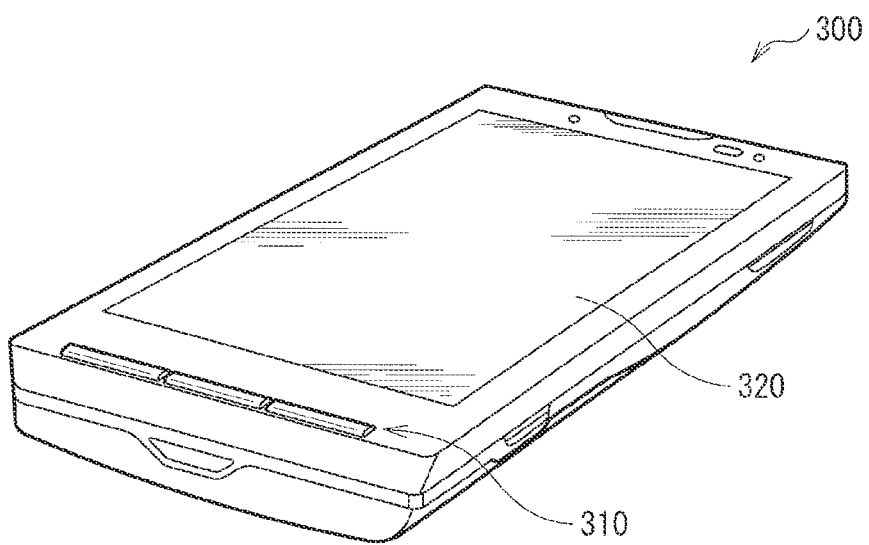

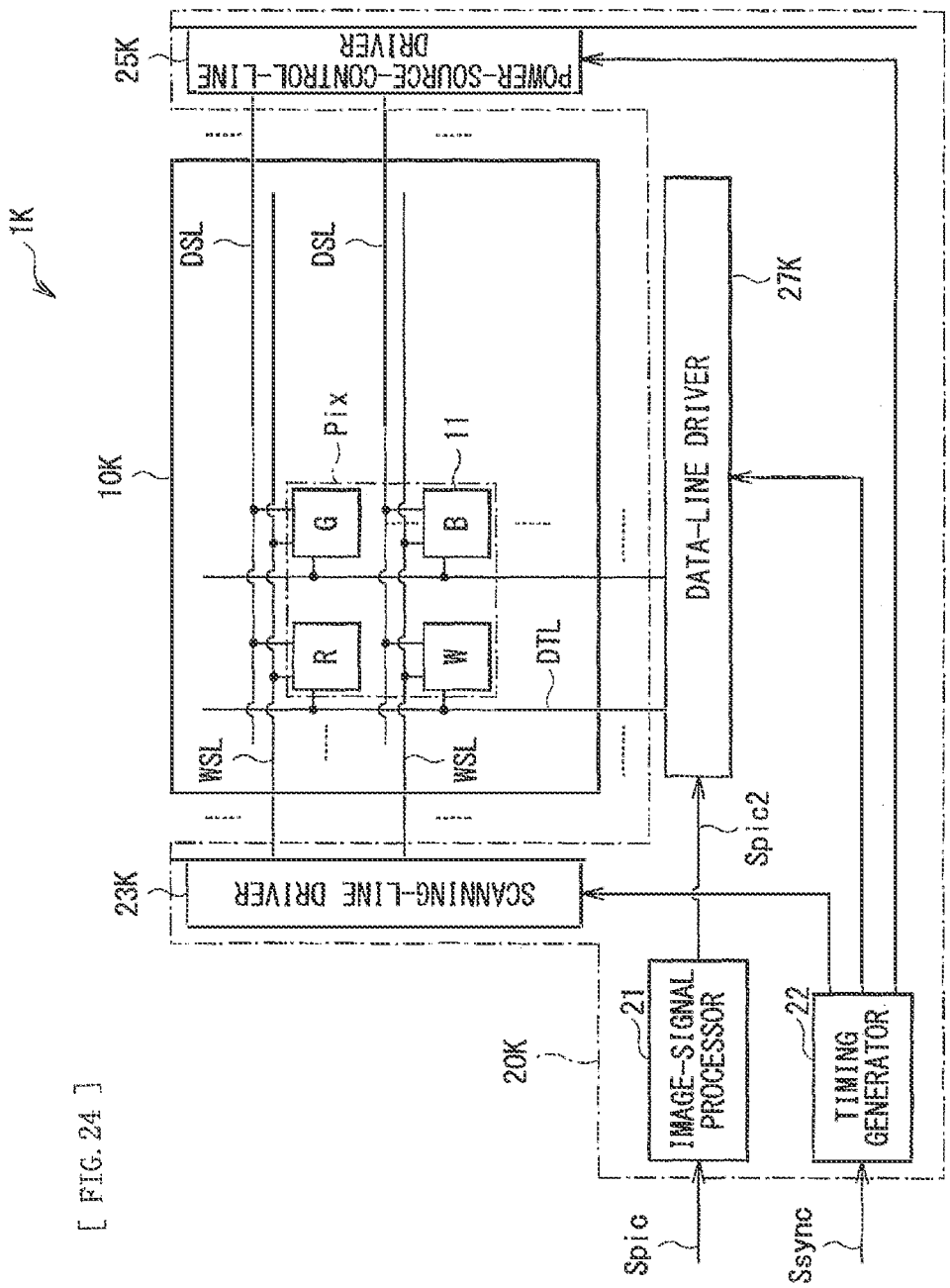
[ FIG. 24 ]

DISPLAY UNIT AND ELECTRONIC APPARATUS

CROSS REFERENCES TO RELATED APPLICATIONS

The present Application is a Continuation Application of U.S. patent application Ser. No. 16/032,457 filed Jul. 11, 2018, now U.S. Pat. No. 10,593,704 issued on Mar. 17, 2020, which is a Continuation Application of U.S. patent application Ser. No. 15/127,745 filed Sep. 20, 2016, now U.S. Pat. No. 10,115,739 issued on Oct. 30, 2018, which is a 371 National Stage Entry of International Application No.: PCT/JP2015/062521, filed on Apr. 24, 2015, which in turn claims priority from Japanese Application No. 2014-096177, filed on May 7, 2014, the entire contents of which are incorporated herein by reference.

TECHNICAL FIELD

The present disclosure relates to a display unit having a current-driven-type display element, and an electronic apparatus with such a display unit.

BACKGROUND ART

In recent years, in the field of display unit performing image display, a display unit (an organic EL (Electro Luminescence) display unit) using a current-driven-type display element in which light emission intensity changes depending on a flowing current value, e.g., an organic EL element, has been developed, and commercialization thereof has been underway. The organic EL element is a self-luminous element unlike elements such as a liquid crystal element, and it is not necessary to provide a light source (backlight) separately. Therefore, the organic EL display unit has such characteristics that visibility of an image is high, power consumption is low, and response speed of the element is high, as compared with a liquid crystal display unit requiring a light source.

For such an organic EL display unit, various technologies for attempting to improve image quality are disclosed. For example, Patent Literature 1 discloses an organic EL display unit that suppresses degradation of image quality due to characteristic variations of a drive transistor in each pixel circuit.

CITATION LIST

Patent Literature

Patent Literature 1: Japanese Unexamined Patent Application Publication No. 2010-145579

SUMMARY

In this way, in a display unit, image quality is desired to be high, and further enhancement of the image quality is expected.

Therefore, it is desirable to provide a display unit and an electronic apparatus that allow for enhancement of image quality.

A display unit according to an embodiment of the present disclosure includes a plurality of pixel circuits. The pixel circuits each include a light-emitting element, a drive transistor that has a drain and a source and supplies a current to the light-emitting element, and a control transistor connected to the drain or the source of the drive transistor. One channel portion is formed for two control transistors in respective adjacent two of the pixel circuits.

An electronic apparatus according to an embodiment of the present disclosure includes the above-described display unit, and may correspond to, for example, an apparatus such as a television apparatus, an electronic book, a smartphone, a digital camera, a laptop personal computer, a video camera, and a head mount display.

In each of the display unit and the electronic apparatus according to the respective embodiments of the present disclosure, the plurality of pixel circuits each including the light-emitting element, the drive transistor, and the control transistor are provided. The one channel portion is formed for the two control transistors in the respective adjacent two of the pixel circuits.

According to each of the display unit and the electronic apparatus in the respective embodiments of the present disclosure, the one channel portion is formed for the two control transistors in the respective adjacent two of the pixel circuits, and therefore it is possible to enhance image quality. Note that effects described here are non-limiting. Effects achieved by the technology may be one or more of effects described in the disclosure.

BRIEF DESCRIPTION OF DRAWINGS

FIG. 1 is a block diagram illustrating a configuration example of a display unit according to an embodiment of the present disclosure.

FIG. 2 is a circuit diagram illustrating a configuration example of a display section illustrated in FIG. 1.

FIG. 3 is a layout diagram illustrating a configuration example of the display section illustrated in FIG. 1.

FIG. 4 is a layout diagram illustrating a configuration example of a control transistor illustrated in FIG. 2.

FIG. 5 is a timing waveform diagram illustrating an operation example of the display unit illustrated in FIG. 1.

FIG. 6 is a layout diagram illustrating a configuration example of a display section according to a comparative example.

FIG. 7 is a block diagram illustrating a configuration example of a display unit according to a modification.

FIG. 8 is a circuit diagram illustrating a configuration example of a display section illustrated in FIG. 7.

FIG. 9 is a layout diagram illustrating a configuration example of the display section illustrated in FIG. 8.

FIG. 10 is a layout diagram illustrating a configuration example of a display section according to a modification.

FIG. 11 is a layout diagram illustrating a configuration example of a display section according to a modification.

FIG. 12 is a layout diagram illustrating a configuration example of a display section according to a modification.

FIG. 13 is a layout diagram illustrating a configuration example of a display section according to a modification.

FIG. 14 is a layout diagram illustrating a configuration example of a control transistor according to a modification.

FIG. 15 is a layout diagram illustrating a configuration example of a control transistor according to a modification.

FIG. 16 is a layout diagram illustrating a configuration example of a display section according to a modification.

FIG. 17 is a layout diagram illustrating a configuration example of a control transistor illustrated in FIG. 16.

FIG. 18 is a block diagram illustrating a configuration example of a display unit according to a modification.

FIG. 19 is a layout diagram illustrating a configuration example of the display section illustrated in FIG. 18.

FIG. 20 is a circuit diagram illustrating a configuration example of a display section according to a modification.

FIG. 21 is a layout diagram illustrating a configuration example of the display section illustrated in FIG. 20.

FIG. 22 is a circuit diagram illustrating a configuration example of a display section according to a modification.

FIG. 23 is a perspective view of an appearance configuration of a smartphone according to an application example.

FIG. 24 is a block diagram illustrating a configuration example of a display unit according to a modification.

EMBODIMENTS FOR CARRYING OUT THE INVENTION

Some embodiments of the present disclosure will be described below in detail with reference to the drawings. It is to be noted that the description will be provided in the following order.
1. Embodiment
2. Application Examples

1. Embodiment

[Configuration Example]

FIG. 1 illustrates a configuration example of a display unit according to an embodiment. A display unit 1 is a display unit of an active matrix system, using an organic EL light-emitting element. This display unit 1 includes a display section 10 and a drive section 20.

The display section 10 is a section in which a plurality of pixels Pix are arranged in a matrix. The pixels Pix each have subpixels 11 (11R, 11G and 11B) of red (R), green (G), and blue (B). In addition, the display section 10 has a plurality of scanning lines WSL and a plurality of power-source control lines DSL extending in a row direction, and a plurality of data lines DTL extending in a column direction. One end of each of the scanning lines WSL, the power-source control lines DSL, and the data lines DTL is connected to the drive section 20.

FIG. 2 illustrates an example of a circuit configuration of the subpixel 11. The subpixel 11 includes a write transistor WSTr, a drive transistor DRTr, a power source transistor DSTr, a control transistor AZTr, capacitors Cs1 and Cs2, and a light-emitting element 19. In other words, in this example, the subpixel 11 has a configuration of a so-called "4Tr2C", which is configured using four transistors (the write transistor WSTr, the drive transistor DRTr, the power source transistor DSTr, and the control transistor AZTr) and the two capacitors Cs1 and Cs2.

The write transistor WSTr, the drive transistor DRTr, the power source transistor DSTr, and the control transistor AZTr may be configured of, for example, a TFT (Thin Film Transistor) of a P-channel MOS (Metal Oxide Semiconductor) type. A gate of the write transistor WSTr is connected to the scanning line WSL, a source thereof is connected to the data line DTL, and a drain thereof is connected to a gate of the drive transistor DRTr and one end of the capacitor Cs1. The gate of the drive transistor DRTr is connected to the drain of the write transistor WSTr and the one end of the capacitor Cs1, a source thereof is connected to a drain of the power source transistor DSTr, the other end of the capacitor Cs1, and one end of the capacitor Cs2, and a drain thereof is connected to a source of the control transistor AZTr and an anode of the light-emitting element 19. A gate of the power source transistor DSTr is connected to the power-source control line DSL, a source thereof is supplied with a voltage Vcc by the drive section 20, and the drain thereof is connected to the source of the drive transistor DRTr, the other end of the capacitor Cs1, and the one end of the capacitor Cs2. A gate of the control transistor AZTr is connected to the scanning line WSL, the source thereof is connected to the drain of the drive transistor DRTr and the anode of the light-emitting element 19, and a drain thereof is supplied with a voltage Vss by the drive section 20. As will be described later, the control transistors AZTr (W1 in FIG. 2) of respective adjacent two of the subpixels 11 in the horizontal direction (the lateral direction) are integrally formed.

The one end of the capacitor Cs1 is connected to the gate of the drive transistor DRTr and some other terminal, and the other end thereof is connected to the source of the drive transistor DRTr and some other terminal. The one end of the capacitor Cs2 is connected to the source of the drive transistor DRTr and the like, and the other end thereof is supplied with the voltage Vcc by the drive section 20. The light-emitting element 19 is an organic EL element that emits light of a color (red, green, or blue) corresponding to each of the subpixels 11, the anode thereof is connected to the drain of the drive transistor DRTr and the source of the control transistor AZTr, and a cathode thereof is supplied with a voltage Vcath by the drive section 20. It is to be noted that, in this example, the light-emitting element 19 is configured using the organic EL element, but is not limited thereto, and any type of element may be used if the element is a current-driven-type light-emitting element.

With this configuration, in the subpixel 11, when the write transistor WSTr is set to an ON state, write operation is performed, and a potential difference corresponding to a pixel voltage Vsig (to be described later) is set between both ends of the capacitor Cs 1. Further, the drive transistor DRTr feeds a driving current, which corresponds to this potential difference between both ends of the capacitor Cs1, to the light-emitting element 19. Therefore, the light-emitting element 19 emits light at a luminance corresponding to the pixel voltage Vsig.

FIG. 3 illustrates a layout configuration of each of the transistors in the subpixel 11. In FIG. 3, a shaded part indicates the gate of each of the transistors. In this example, each of the transistors is of a staggered type (so-called top-gate type) that forms a channel portion CH between a substrate and a gate. It is to be noted that this is not limitative and, in place of this, for example, an inverted-staggered type (so-called bottom-gate type) that forms a channel portion CH in a layer above a gate may be adopted.

As illustrated in FIG. 3, the four transistors are formed in each of the subpixels 11. The drain and the source of each of the transistors are formed to face each other with the gate in between. A contact CT is formed at the drain and the source of each of the transistors. In this example, the power source transistor DSTr, the drive transistor DRTr, and the control transistor AZTr are continuously disposed. Specifically, the drain of the power source transistor DSTr and the source of the drive transistor DRTr are integrally formed, and the drain of the drive transistor DRTr and the source of the control transistor AZTr are integrally formed.

It is to be noted, in this example, the power source transistor DSTr, the drive transistor DRTr, and the control transistor AZTr are illustrated to be equal in channel width, but are not limited thereto, and instead of this, for example, these transistors may have different channel widths.

The write transistor WSTr is formed away from the three other transistors. The write transistor WSTr and the control transistor AZTr are aligned in the horizontal direction (the lateral direction), and the gate of the write transistor WSTr and the gate of the control transistor AZTr are connected to each other and integrally formed. Further, the gate of the write transistor WSTr and the gate of the control transistor AZTr aligned in the horizontal direction in each of the subpixels 11 for one row are connected to each other. In other words, in the display section 10, these gates serve as the scanning lines WSL.

In the display section 10, layouts of respective adjacent two of the subpixels 11 in the horizontal direction (the lateral direction) are reversals of each other in the lateral direction. Specifically, in this example, the layout of the subpixel 11R and the layout of the subpixel 11G adjacent thereto on the right are reversals of each other in the lateral direction, and the layout of the subpixel 11B and the layout of the subpixel 11R adjacent thereto on the right are reversals of each other in the lateral direction. Further, in the respective adjacent two of the subpixels 11, the respective control transistors AZTr are integrally formed.

FIG. 4 illustrates a layout configuration of the control transistors AZTr in the respective adjacent two of the subpixels 11. In the respective adjacent two of the subpixels 11, a source ES1 and a source ES2 of the respective control transistors AZTr are separately formed. In contrast, one gate EG and one drain ED are formed for the two control transistors AZTr. Therefore, the one channel portion CH (a shaded part) is formed for the two control transistors AZTr. In other words, the channel portion CH is formed by connecting the channel portions of the respective two transistors with a connection part PC. With this configuration, in the display section 10, when the two control transistors AZTr are set to an ON state, the equivalent channel width is allowed to increase, and therefore ON resistance is allowed to decrease.

In addition, in the display section 10, a length Lch of the channel portion CH near the border between the adjacent two of the subpixels 11 is shorter than a width W of the gate EG. Specifically, among ends of the channel portion CH near the border between the adjacent two of the subpixels 11, an end E1 on a side (an upper side), on which the drive transistor DRTr is disposed, is provided in a region corresponding to the gate EG, so that the length Lch of the channel portion CH is shorter than the width W of the gate EG Therefore, in the display section 10, it is possible to isolate the source ES1 and the source ES2 electrically from each other, when the control transistors AZTr is set to an OFF state.

The drive section 20 is a section that drives the display section 10 on the basis of an image signal Spic and a synchronization signal Ssync supplied from outside. As illustrated in FIG. 1, this drive section 20 includes an image-signal processor 21, a timing generator 22, a scanning-line driver 23, a power-source-control-line driver 25, and a data-line driver 27.

The image-signal processor 21 performs predetermined signal processing on the image signal Spic supplied from outside to generate an image signal Spic2. Examples of this predetermined signal processing include gamma correction and overdrive correction.

The timing generator 22 supplies a control signal to each of the scanning-line driver 23, the power-source-control-line driver 25, and the data-line driver 27 on the basis of the synchronization signal S sync supplied from outside, thereby controlling these drivers to operate in synchronization.

The scanning-line driver 23 sequentially selects the subpixels 11 row by row, by sequentially applying a scanning signal WS to the plurality of scanning lines WSL, in accordance with the control signal supplied from the timing generator 22.

The power-source-control-line driver 25 controls emission operation and extinction operation of the subpixels 11 row by row, by sequentially applying a power-source control signal DS to the plurality of power-source control lines DSL, in accordance with the control signal supplied from the timing generator 22.

The data-line driver 27 generates a signal Sig, in accordance with the image signal Spic 2 supplied from the image-signal processor 21 and the control signal supplied from the timing generator 22. At the time, the data-line driver 27 generates the signal Sig, by alternately providing the pixel voltage Vsig indicating the light emission intensity of each of the subpixels 11 and a voltage Vofs that is used to perform Vth correction to be described later. The data-line driver 27 is configured to apply the signal Sig thus generated, to each of the data lines DTL.

As will be described later, this configuration allows the drive section 20 to perform initialization for the subpixel 11, and to perform correction (the Vth correction and μ (mobility) correction) for suppression of influence of element variations of the drive transistor DRTr on image quality, and to write the pixel voltage Vsig.

[Workings and Operation and Action]

Next, operation and action of the display unit 1 of the present embodiment will be described.

(Summary of Overall Operation)

First, a summary of overall operation of the display unit 1 will be described with reference to FIG. 1. The drive section 20 drives the display section 10 on the basis of the image signal Spic and the synchronization signal Ssync supplied from outside. Specifically, the image-signal processor 21 performs the predetermined signal processing on the image signal Spic supplied from outside to generate the image signal Spic2. The timing generator 22 supplies the control signal to each of the scanning-line driver 23, the power-source-control-line driver 25, and the data-line driver 27 on the basis of the synchronization signal S sync supplied from outside, thereby controlling these drivers to operate in synchronization. The scanning-line driver 23 sequentially selects the subpixels 11 row by row, by sequentially applying the scanning signal WS to the plurality of scanning lines WSL in accordance with the control signal supplied from the timing generator 22. The power-source-control-line driver 25 controls the emission operation and the extinction operation of the subpixels 11 row by row, by sequentially applying the power-source control signal DS to the plurality of power-source control lines DSL in accordance with the control signal supplied from the timing generator 22. The data-line driver 27 generates the signal Sig including the pixel voltage Vsig corresponding to the luminance of each of the subpixels 11 in accordance with the image signal Spic2 supplied from the image-signal processor 21 and the control signal supplied from the timing generator 22, and applies the generated signal Sig to each of the data lines DTL. The display section 10 performs display on the basis of the scanning signal WS, the power-source control signal DS, and the signal Sig supplied from the drive section 20.

(Detailed Operation)

Next, detailed operation of the display unit 1 will be described.

FIG. 5 illustrates a timing chart of display operation in the display unit 1. This figure illustrates an operation example of display driving for the one subpixel 11 of interest. In FIG. 5, (A) indicates a waveform of the scanning signal WS, (B)

indicates a waveform of the power-source control signal DS, (C) indicates a waveform of the signal Sig, (D) indicates a waveform of a source voltage Vs of the drive transistor DRTr, and (E) indicates a waveform of a gate voltage Vg of the drive transistor DRTr. In FIG. 5, (D) and (E) indicate the respective waveforms by using the same voltage axis.

In one horizontal period (1H), the drive section 20 initializes the subpixel 11 (an initialization period P1), performs the Vth correction for suppression of the influence of the element variations of the drive transistor DRTr on the image quality (a Vth correction period P2), writes the pixel voltage Vsig to the subpixel 11, and performs the µ (mobility) correction different from the Vth correction (a writing/µ-correction period P3). Further, afterward, the light-emitting element 19 of the subpixel 11 emits light at a luminance corresponding to the written pixel voltage Vsig (a light emission period P4). Details thereof will be described below.

First, the power-source-control-line driver 25 changes the voltage of the power-source control signal DS from a low level to a high level at timing t1 ((B) in FIG. 5). The power source transistor DSTr is thereby set to an OFF state, current feeding to the light-emitting element 19 stops, and the light-emitting element 19 stops emitting light.

Next, the data-line driver 27 sets the signal Sig to the voltage Vofs at timing t2 ((C) in FIG. 5). Further, the power-source-control-line driver 25 changes the voltage of the power-source control signal DS from the high level to the low level at timing t3 ((B) in FIG. 5). The power source transistor DSTr is thereby set to an ON state, and the voltage Vcc is supplied to the source of the drive transistor DRTr (the capacitor Cs1).

Next, the drive section 20 initializes the subpixel 11 during a period of timing t4 to timing t5 (the initialization period P1). Specifically, at the timing t4, the scanning-line driver 23 changes the voltage of the scanning signal WS from a high level to a low level ((A) In FIG. 5). The write transistor WSTr and the control transistor AZTr is thereby set to the ON state. The gate voltage Vg of the drive transistor DRTr (one end of the capacitor Cs1) is set to the voltage Vofs, by setting the write transistor WSTr to the ON state ((E) in FIG. 5). A voltage difference (Vcc-Vofs) between both ends of the capacitor Cs1 is thereby set to a value larger than an absolute value of a threshold voltage Vth of the drive transistor DRTr, and the subpixel 11 is initialized.

Further, at the timing t4, the voltage Vss is supplied to the drain of the drive transistor DRTr by setting the control transistor AZTr to the ON state. This voltage Vss, in this example, may be a voltage lower than the sum of the voltage Vcath of the cathode of the light-emitting element 19 and a threshold voltage Von of the light-emitting element 19 (Vss<Vcath+Von). Therefore, an anode-cathode voltage of the light-emitting element 19 is lower than the threshold voltage Von, and thus no current flows through the light-emitting element 19. This state continues until timing t6, and, in the meantime, the light-emitting element 19 maintains an extinction state.

Next, the drive section 20 performs the Vth correction during a period of the timing t5 to the timing t6 (the Vth correction period P2). Specifically, the power-source-control-line driver 25 changes the voltage of the power-source control signal DS from the low level to the high level at the timing t5 ((B) in FIG. 5). The power source transistor DSTr is thereby set to the OFF state, and a current flows from the other end of the capacitor Cs1, through the drive transistor DRTr and the control transistor AZTr in this order. Thus, the capacitor Cs1 is discharged. In other words, at the timing t5, the voltage difference between both ends of the capacitor Cs1 is larger than the absolute value of the threshold voltage Vth of the drive transistor DRTr, and therefore a current corresponding to a gate-source voltage Vgs flows from the source to the drain of the drive transistor DRTr. The source voltage Vs of the drive transistor DRTr thereby gradually decreases ((D) in FIG. 5). With accompanying this decrease in the source voltage Vs, the absolute value of the gate-source voltage Vgs of the drive transistor DRTr decreases, and therefore the current flowing through the drive transistor DRTr also gradually decreases. By such negative feedback operation, the source voltage Vs of the drive transistor DRTr converges to a voltage expressed by the sum of the voltage Vofs and the absolute value of the threshold voltage Vth of the drive transistor DRTr (Vofs +|Vth|). In other words, at this moment, the voltage difference between both ends of the capacitor Cs1 (the absolute value of the gate-source voltage Vgs of the drive transistor DRTr) is equal to the absolute value of the threshold voltage Vth of the drive transistor DRTr (|Vgs|=|Vth|).

Next, the scanning-line driver 23 changes the voltage of the scanning signal WS from the low level to the high level at the timing t6 ((A) in FIG. 5). The write transistor WSTr and the control transistor AZTr is thereby set to the OFF state. Further, at the timing t7, the data-line driver 27 sets the signal Sig to the pixel voltage Vsig ((C) in FIG. 5).

Next, during a period of timing t8 to timing t9 (the writing/µ-correction period P3), the drive section 20 writes the pixel voltage Vsig to the subpixel 11 and performs the µ correction. Specifically, at the timing t8, the scanning-line driver 23 changes the voltage of the scanning signal WS from the high level to the low level ((A) in FIG. 5). The write transistor WSTr and the control transistor AZTr are thereby set to the ON state. The write transistor WSTr set to the ON state causes the gate voltage Vg of the drive transistor DRTr to decrease from the voltage Vofs to the pixel voltage Vsig ((E) in FIG. 5). At this moment, the absolute value of the gate-source voltage Vgs of the drive transistor DRTr is larger than the absolute value of the threshold voltage Vth (|Vgs|>|Vth|), and therefore a current flows from the source to the drain of the drive transistor DRTr, and the source voltage Vs of the drive transistor DRTr decreases ((D) in FIG. 5). With accompanying this decrease in the source voltage Vs, the absolute value of the gate-source voltage Vgs of the drive transistor DRTr decreases, and therefore the current flowing through the drive transistor DRTr also gradually decreases. By such negative feedback operation, the influence of the element variations of the drive transistor DRTr is suppressed (the µ correction), and the gate-source voltage Vgs of the drive transistor DRTr is set to a voltage corresponding to the pixel voltage Vsig.

Further, the voltage Vss is supplied to the drain of the drive transistor DRTr by setting the control transistor AZTr to the ON state at the timing t8, and the light-emitting element 19 maintains the extinction state during the period of the timing t8 to the timing t9.

Next, at the timing t9, the scanning-line driver 23 changes the voltage of the scanning signal WS from the low level to the high level ((A) in FIG. 5). The write transistor WSTr and the control transistor AZTr are thereby set to the OFF state. As a result, the gate of the drive transistor DRTr becomes floating, and therefore an inter-terminal voltage of the capacitor Cs1, namely, the gate-source voltage Vgs of the drive transistor DRTr, is substantially maintained thereafter.

Next, the drive section 20 causes the subpixel 11 to emit light during a period of timing t10 and thereafter (the light emission period P4). Specifically, at the timing t10, the power-source-control-line driver 25 changes the voltage of the power-source control signal DS from the high level to the low level ((B) in FIG. 5). The power source transistor DSTr is thereby set to the ON state, the voltage Vcc is supplied to the source of the drive transistor DRTr, and the drive transistor DRTr feeds a current corresponding to the pixel voltage Vsig to the light-emitting element 19, thereby causing the light-emitting element 19 to emit light.

Subsequently, after a lapse of a period corresponding to a light-emission duty ratio, the drive section 20 changes the voltage of the power-source control signal DS from the low level to the high level in a manner similar to the operation at the timing t1, thereby ending the light emission period P4.

In the display unit 1, the control transistor AZTr is in the ON state during the initialization period P1, the Vth correction period P2, and the writing/μ-correction period P3, and therefore it is possible to enhance the image quality. In other words, it may be desirable that the light-emitting element 19 stop emitting light during a period except for the light emission period P4. Accordingly, when a current flows through the light-emitting element 19 during the period except for the light emission period P4, the light-emitting element 19 emits light, which may, for example, decrease the contrast ratio, and degrade the image quality. In contrast, in the display unit 1, the control transistor AZTr is in the ON state during the initialization period P1, the Vth correction period P2, and the writing/μ-correction period P3, and therefore it is possible to reduce a possibility that a current flows through the light-emitting element 19, and thus, for example, it may be possible to increase the contrast ratio, and to enhance the image quality.

In particular, in the display section 10, the control transistors AZTr in the respective adjacent two of the subpixels 11 are integrally formed as illustrated in FIG. 4, and therefore it is possible to decrease the ON resistance, thereby making it possible to enhance the image quality. In other words, for example, when the ON resistance is not sufficiently low, an anode voltage of the light-emitting element 19 may not be sufficiently lowered even if the control transistor AZTr is set to the ON state, and in this case, a current may flow through the light-emitting element 19. In contrast, in the display unit 1, the control transistors AZTr in the respective adjacent two of the subpixels 11 are integrally formed, and therefore it is possible to increase the equivalent channel width when the two control transistors AZTr is set to the ON state, and therefore it is possible to decrease the ON resistance. Therefore, during the initialization period P1, the Vth correction period P2, and the writing/μ-correction period P3, it is possible to further reduce the possibility that the current flows through the light-emitting element 19, and thus, for example, it may be possible to increase the contrast ratio, and to enhance the image quality.

Comparative Example

Next, the action of the present embodiment will be described making a comparison with a comparative example. In a display unit 1R according to the comparative example, a layout configuration of a control transistor AZTr is different from that of the present embodiment. Other configurations are similar to those of the present embodiment (FIG. 1).

FIG. 6 illustrates a configuration example of a display section 10R of the display unit 1R. In the display section 10R, the control transistor AZTr is formed in each of subpixels 11, as with a power source transistor DSTr and a drive transistor DRTr. In other words, while the control transistors AZTr in the respective adjacent two of the subpixels 11 are integrally formed in the display section 10 according to the present embodiment, the control transistors AZTr in the respective adjacent two of the subpixels 11 are formed as separate transistors in the display section 10R according to the comparative example.

Therefore, in the display unit 1R, ON resistance of the control transistor AZTr becomes high, which may, for example, decrease a contrast ratio, and degrade image quality. In addition, for example, when a channel width is increased to decrease the ON resistance of the control transistor AZTr, a pixel size may increase, and thus a pixel density may decrease.

In contrast, in the display unit 1 according to the present embodiment, the control transistors AZTr in the respective adjacent two of the subpixels 11 are integrally formed as illustrated in FIGS. 3 and 4. In other words, a region between the two subpixels 11 is effectively utilized, and the channel portion CH is formed in this region. Therefore, in the display unit 1, it is possible to decrease the ON resistance while reducing a possibility of an increase in pixel size. As a result, in the display unit 1, it is possible to increase a pixel density, and to enhance the image quality.

[Effect]

As described above, in the present embodiment, the control transistors in the respective adjacent two of the subpixels are integrally formed, and therefore it is possible to enhance the image quality.

[Modification 1]

In the above-described embodiment, the write transistor WSTr and the control transistor AZTr are simultaneously turned on/off, but are not limited to thereto. A display unit 1B according to the present modification will be described below in detail.

FIG. 7 illustrates a configuration example of the display unit 1B. The display unit 1B includes a display section 10B and a drive section 20B. The display section 10B has subpixels 12 (12R, 12G, and 12B) of red (R), green (G), and blue (B), and a plurality of control lines AZL extending in a row direction. One end of each of the control lines AZL is connected to the drive section 20B.

FIG. 8 illustrates an example of a circuit configuration of the subpixel 12. The subpixel 12 includes the write transistor WSTr, the drive transistor DRTr, the power source transistor DSTr, the control transistor AZTr, the light-emitting element 19, and the capacitors Cs1 and Cs2, as with the subpixel 11 according to the above-described embodiment. In this example, the gate of the control transistor AZTr is connected to the control line AZL, the source thereof is connected to the drain of the drive transistor DRTr and the anode of the light-emitting element 19, and the drain thereof is supplied with the voltage Vss by the drive section 20B. In other words, while the gate of the control transistor AZTr is connected to the scanning line WSL in the subpixel 11 according to the above-described embodiment, the gate of the control transistor AZTr is connected to the control line AZL in the subpixel 12 according to the present modification. The control transistors AZTr (W1 in FIG. 8) of the respective adjacent two of the subpixels 12 in the horizontal direction (the lateral direction) are integrally formed, as with those of the above-described embodiment.

FIG. 9 illustrates a layout configuration of each of the transistors in the subpixel 12. In the subpixel 12, the gate of the write transistor WSTr is formed as a gate separate from the gate of the control transistor AZTr. This is because the gate of the write transistor WSTr and the gate of the control transistor AZTr are connected to the signal lines different from each other, as illustrated in FIG. 8.

The drive section 20B drives the display section 10B on the basis of the image signal Spic and the synchronization signal Ssync supplied from outside. This drive section 20B includes a timing generator 22B, a scanning-line driver 23B, a control-line driver 24B, and a power-source-control-line driver 25B, as illustrated in FIG. 7. The control-line driver 24B controls on-off operation of the control transistor AZTr row by row, by sequentially applying a control signal AZ to the plurality of control lines AZL in accordance with a control signal supplied from the timing generator 22B.

This configuration makes it possible to increase flexibility of operation in driving the subpixel 12, in the display unit 1B. In this configuration as well, it is possible to obtain an effect similar to the effect of the display unit according to the above-described embodiment.

[Modification 2]

In the above-described embodiment, two contacts CT are provided in the one drain shared by the two control transistors AZTr as illustrated in FIGS. 3 and 4, but this is not limitative, and instead of this, for example, one contact CT may be provided as illustrated in FIG. 10. In this example, the width of the drain in the horizontal direction (the lateral direction) is slightly narrowed, and ends of both sides of a channel CH in the horizontal direction are inclined. Such a configuration makes it possible to reduce the pixel size, thereby making it possible to increase the pixel density.

Further, as illustrated in FIG. 11, the control transistors AZTr related to the respective adjacent four of the subpixels 11 in the horizontal direction (the lateral direction) and a vertical direction (a longitudinal direction) may be configured to share one drain, and one contact CT may be provided at the drain. In this example, layouts of adjacent two of the subpixels 11 in the vertical direction are reversals of each other in the vertical direction. This allows the four subpixels 11 to be configured to share the one drain. This configuration makes it possible to reduce the pixel size further, thereby making it possible to increase the pixel density.

[Modification 3]

In the above-described embodiment, a the two control transistors AZTr are integrally formed s illustrated in FIG. 3, but this is not limitative, and instead of this, for example, three or more of the control transistors AZTr may be integrally formed. FIG. 12 illustrates an example in which the three control transistors AZTr are integrally formed. In this configuration as well, it is possible to obtain an effect similar to the effect of the display unit according to the above-described embodiment.

[Modification 4]

In the above-described embodiment, the drain of the drive transistor DRTr and the source of the control transistor AZTr are integrally formed as illustrated in FIG. 3, but this is not limitative, and instead of this, for example, these may be separately formed as illustrated in FIG. 13 and connected to each other through a wiring LL. Therefore, for example, when the drive transistor DRTr is configured as a high breakdown voltage transistor and the control transistor AZTr is configured as a normal transistor, it may be possible to reduce a parasitic capacitance and to increase the speed of operation of the subpixel 11 further. In other words, there is a case where a parasitic capacitance becomes large at a drain or source of a high voltage transistor, and in such a case, it is possible to reduce the parasitic capacitance of the entire subpixel 11 by forming the transistors separately.

[Modification 5]

In the above-described embodiment, the end E1 of the channel portion CH near the border between adjacent two of the subpixels 11 are extended in the horizontal direction (the lateral direction) as illustrated in FIGS. 3 and 4, but this is not limitative, and instead of this, for example, the shape of an end E2 of the channel portion CH may be shaped like a letter "V" of the alphabet, as illustrated in FIGS. 14 and 15. In the example in FIG. 14, the present modification is applied to the configuration (FIGS. 3 and 4) of the above-described embodiment, and in the example in FIG. 15, the present modification is applied to the configuration of Modification 2 (FIG. 10). However, this is not limitative, and instead of this, for example, a shape like a letter "U" of the alphabet may be adopted.

Therefore, for example, even if the position of the gate EG is shifted in the vertical direction (the longitudinal direction) when the gate EG is formed, it may be possible to increase tolerance of the shift. In other words, for example, in the configuration (FIG. 4) of the above-described embodiment, when the gate EG is shifted downward in FIG. 4, and an upper end of the gate EG is placed below the end E1 of the channel portion CH, the source ES1 and the source ES2 may be electrically connected even if the control transistor AZTr is in the OFF state. Further, to prevent this, the channel portion CH may be formed to place the end E1 of the channel portion CH at a position lower than that in the example in FIG. 4, but in this case, the equivalent channel width when the control transistor AZTr is set to the ON state may be narrowed, and the ON resistance may increase. In contrast, in the present modification, the end E2 of the channel portion CH is formed in a shape like a letter "V" of the alphabet, and therefore it is possible to increase the tolerance when the gate EG is shifted, while reducing the possibility of a reduction in equivalent channel width.

[Modification 6]

In the above-described embodiment, the drain and the source of the control transistor AZTr are disposed to face each other with the gate in between as illustrated in FIGS. 3 and 4, but this is not limitative, and instead of this, the drain may be disposed on the same side as the side where the source is disposed as viewed from the gate, as illustrated in FIGS. 16 and 17. In this example, the drain of the control transistor AZTr is disposed between the sources of the respective two control transistors AZTr. Further, as illustrated in FIG. 17, a lower end E3 of the channel portion CH is provided in a region corresponding to the gate EG. This configuration makes it possible to reduce the pixel size further, and to increase the pixel density.

[Modification 7]

In the above-described embodiment, the control transistors AZTr of the respective adjacent two of the subpixels 11 in the horizontal direction (the lateral direction) are integrally formed, but this is not limitative, and instead of this, for example, the control transistors AZTr of the respective adjacent four of the subpixels 11 in the horizontal direction and the vertical direction may be integrally formed. The present modification will be described below in detail.

FIG. 18 illustrates a configuration example of a display unit 1H according to the present modification. The display unit 1H has a display section 10H and a drive section 20H. In the display section 10H, the subpixels 11 for two adjacent rows are connected to the same scanning line WSL and connected to the same power-source control line DSL. The drive section 20H has a scanning-line driver 23H, a power-source-control-line driver 25H, and a data-line driver 27H.

FIG. 19 illustrates a layout configuration in the display section 10H. In this example, layouts of the subpixels 11 for the two adjacent rows are reversals of each other in the vertical direction. Further, the write transistors WSTr and the control transistors AZTr in the subpixels 11 for the two rows are aligned in the horizontal direction (the lateral direction), and the gates of these transistors are connected to each other. In other words, in the display section 10H, these gates serve as the scanning lines WSL. The gates of the control transistors AZTr in the respective adjacent four of the subpixels 11 in the horizontal direction and the vertical direction are integrally formed. Further, the drains of the respective four control transistors AZTr are integrally formed as with the case of Modification 6 (FIG. 16). The one channel portion CH is thereby formed for the four control transistors AZTr. This configuration makes it possible to reduce the pixel size further, and to increase the pixel density.

[Modification 8]

In the above-described embodiment, the two control transistors AZTr are integrally formed, but this is not limitative, and instead of this, for example, in addition to the two control transistors AZTr, two power source transistors DSTr (W2 in FIG. 20) may be integrally formed, as illustrated in FIGS. 20 and 21.

[Modification 9]

The circuit configuration of the subpixel 11 may be any of various configurations other than the configuration illustrated in FIG. 2. An example thereof will be described below.

FIG. 22 illustrates a configuration example of a subpixel 13 according to the present modification. The subpixel 13 includes the write transistor WSTr, the drive transistor DRTr, the power source transistor DSTr, the control transistor AZTr, a capacitor Cs, and the light-emitting element 19. The write transistor WSTr, the drive transistor DRTr, the power source transistor DSTr, and the control transistor AZTr are each configured of a TFT of an N-channel MOS type in this example. The gate of the write transistor WSTr is connected to the scanning line WSL, the source thereof is connected to the data line DTL, and the drain thereof is connected to the gate of the drive transistor DRTr and one end of the capacitor Cs. The gate of the drive transistor DRTr is connected to the drain of the write transistor WSTr and the one end of the capacitor Cs, the drain thereof is connected to the source of the power source transistor DSTr, and the source thereof is connected to the drain of the control transistor AZTr, the other end of the capacitor Cs, and the anode of the light-emitting element 19. The gate of the power source transistor DSTr is connected to the power-source control line DSL, the drain thereof is supplied with the voltage Vcc, and the source thereof is connected to the drain of the drive transistor DRTr. The gate of the control transistor AZTr is connected to the control line AZL, the drain thereof is connected to the other end of the capacitor Cs, the source of the drive transistor DRTr, and the anode of the light-emitting element 19, and the source thereof is supplied with the voltage Vss. The one end of the capacitor Cs is connected to the gate of the drive transistor DRTr and some other terminal, and the other end thereof is connected to the source of the drive transistor DRTr and some other terminal. The anode of the light-emitting element 19 is connected to the source of the drive transistor DRTr and some other terminal, and the cathode thereof is supplied with the voltage Vcath. In this example, two control transistors AZTr (W3 in FIG. 22) are integrally formed, and likewise, two power source transistors DSTr (W4 in FIG. 20) are integrally formed.

[Other Modification]

Further, two or more of these modifications may be combined.

<2. Application Examples>

Next, application examples of the display unit described in the above-described embodiment will be described. The display unit of the above-described embodiment is applicable to electronic apparatuses in all fields that perform display on the basis of externally-inputted image signals or internally-generated image signals, such as television apparatuses, electronic books, smartphones (multifunctional mobile phones), digital cameras, laptop personal computers, video cameras, and head mount displays.

FIG. 23 illustrates an appearance of a smartphone 300. This smartphone 300 has an operation section 310 and a display section 320, and the display section 320 is configured of the above-described display unit.

The display unit described in the above-described embodiment is applicable to various electronic apparatuses. The present technology greatly contributes to enhancement of image quality in such electronic apparatuses.

The present technology is described above using the embodiment, the modifications thereof, and the examples of application to the electronic apparatuses, but the present technology is not limited thereto, and is variously modifiable.

For example, in the above-described embodiment and the examples, the pixel Pix is configured using the three subpixels 11 of red, green, and blue, but this is not limitative, and instead of this, for example, the pixel Pix may be configured using four subpixels 11 of red, green, blue, and white, as represented by a display unit 1K illustrated in FIG. 24. The display unit 1K includes a display section 10K and a drive section 20K. The pixels Pix of the display section 10K each have the four subpixels 11 (11R, 11G, 11B, and 11W) of red (R), green (G), blue (B), and white (W). The drive section 20K drives the display section 10K, and has a scanning-line driver 23K, a power-source-control-line driver 25K, and a data-line driver 27K.

It is to be noted that the effects described in the present specification are illustrative and non-limiting. Effects achieved by the present technology may be effects other than those described above.

It is to be noted that the present technology may adopt the following configurations.

(1) A display unit, including:
a plurality of pixel circuits each including a light-emitting element, a drive transistor that has a drain and a source and supplies a current to the light-emitting element, and a control transistor connected to the drain or the source of the drive transistor,
wherein one channel portion is formed for two control transistors in respective adjacent two of the pixel circuits.

(2) The display unit according to (1), wherein
the control transistors each have a drain, a gate, and a source, and the adjacent two of the pixel circuits are adjacent to each other in a first direction,
the gates of the respective two control transistors are integrally formed to extend in the first direction, and
the drains of the respective two control transistors are connected to respective drive transistors of the respective adjacent two of the pixel circuits and formed separately from each other, and the sources of the respective two control transistors are integrally formed, or
the sources of the respective two control transistors are connected to respective drive transistors of the respective adjacent two of the pixel circuits and formed separately from each other, and the drains of the respective two control transistors are integrally formed.

(3) The display unit according to (2), wherein, in the channel portion, a channel length in a second direction at a connection portion is shorter than a width in the second direction of the integrally-formed gate of the control transistors, the second direction intersecting the first direction, the connection portion being formed between the adjacent two of the pixel circuits.

(4) The display unit according to (3), wherein an end of the connection portion is provided in a region corresponding to the integrally-formed gate of the two control transistors, the end being on side where the drains or the sources connected to the drive transistors of the respective adjacent two of the pixel circuits are provided.

(5) The display unit according to (3) or (4), wherein the channel length of the connection portion is shortest in vicinity of a midpoint between the adjacent two of the pixel circuits.

(6) The display unit according to any one of (2) to (5), wherein layout patterns of the respective adjacent two of the pixel circuits are reversals of each other in the first direction.

(7) The display unit according to (6), wherein layout patterns of respective adjacent two of the pixel circuits in the second direction intersecting the first direction are reversals of each other in the second direction.

(8) The display unit according to (7), wherein in the adjacent two of the pixel circuits and two of the pixel circuits which are adjacent to the adjacent two of the pixel circuits in the second direction, one channel portion is formed for four control transistors of these four pixel circuits.

(9) The display unit according to (8), wherein the drains of the respective four control transistors are connected to respective drive transistors of the respective four pixel circuits and formed separately from one another, and the sources of the respective four control transistors are integrally formed, or the sources of the respective four control transistors are connected to respective drive transistors of the respective four pixel circuits and formed separately from one another, and the drains of the respective four control transistors are integrally formed.

(10) The display unit according to any one of (2) to (9), wherein the drain and the source of each of the control transistors are formed to face each other with the gate of the control transistor in between.

(11) The display unit according to any one of (2) to (9), wherein the drains and the sources of the two control transistors are formed on same side as seen from the gate of each of those two control transistors is provided.

(12) The display unit according to any one of (1) to (11), wherein the drive transistor has a gate, the pixel circuits each further include a capacitor inserted between the gate and the source of the drive transistor, a write transistor that supplies a pixel voltage to the gate of the drive transistor by being set to an ON state, and a power source transistor that supplies a power source voltage to the source of the drive transistor by being set to an ON state, and the drain of the drive transistor is connected to a source of the control transistor and the light-emitting element.

(13) The display unit according to (12), wherein a gate of the write transistor is formed integrally with the gate of the control transistor in the pixel circuit to which the write transistor belongs.

(14) The display unit according to (12) or (13), wherein the drain of the drive transistor and the source of the control transistor are integrally configured to connect the drain of the drive transistor and the source of the control transistor.

(15) The display unit according to (12) or (13), wherein the drain of the drive transistor and the source of the control transistor are connected by a wiring.

(16) An electronic apparatus, including:

a display section; and a control section that performs operation control for the display section, wherein the display section includes a plurality of pixel circuits each including a light-emitting element, a drive transistor that has a drain and a source and supplies a current to the light-emitting element, and a control transistor connected to the drain or the source of the drive transistor, and one channel portion is formed for two control transistors in respective adjacent two of the pixel circuits.

This application claims the priority on the basis of Japanese Patent Application No. 2014-096177 filed on May 7, 2014 with Japan Patent Office, the entire contents of which are incorporated in this application by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device, comprising:

a substrate; and a first pixel, a second pixel, a third pixel and a fourth pixel disposed on the substrate;

each of the first pixel, the second pixel and the third pixel including a driving transistor, a writing transistor, a first switching transistor and a light emitting element, wherein the first switching transistor is electrically connected to an anode electrode of the light emitting element, the first pixel and the second pixel are arranged along a first direction, the first pixel and the third pixel are arranged along a second direction perpendicular to the first direction, a channel region of the first switching transistor in the first pixel and a channel region of the first switching transistor in the second pixel are separately arranged along the first direction, and the channel region of the first switching transistor in the first pixel and a channel portion of the first switching transistor in the third pixel are continuously formed along the second direction.

2. The display device according to claim 1, further comprising:

a first scanning line connected to a control terminal of the first switching transistor in the first pixel and the third pixel.

3. The display device according to claim 2, wherein the first scanning line is connected to a control terminal of the first switching transistor and the writing transistor in the first pixel.

4. The display device according to claim 1, further comprising:

a first contact hole located between a first terminal of the first switching transistor and a first terminal of the driving transistor.

5. The display device according to claim 1, further comprising:

a second scanning line connected to a control terminal of the driving transistor in the first pixel and the third pixel.

6. The display device according to claim 1, wherein each of the first pixel, the second pixel, the third pixel and the fourth pixel include a second switching transistor, and the second switching transistor is electrically connected to a second terminal of the driving transistor.

7. The display device according to claim 1, wherein a channel region of the driving transistor in the first pixel and a channel portion of the driving transistor in the third pixel are continuously formed along the second direction.

8. The display device according to claim 1, wherein a channel region of the second switching transistor in the first pixel and a channel portion of the second switching transistor in the third pixel are continuously formed along the second direction.

9. The display device according to claim 1, wherein the channel region of the first switching transistor in the first pixel and the channel portion of the first switching transistor in the third pixel are disposed at a semiconductor layer.

\* \* \* \* \*